i930,334 B2

United States Patent
Littrell et al.

(10) Patent No.: US 11,930,334 B2
(45) Date of Patent: Mar. 12, 2024

(54) PIEZOELECTRIC MEMS DEVICE WITH AN ADAPTIVE THRESHOLD FOR DETECTION OF AN ACOUSTIC STIMULUS

(71) Applicant: Qualcomm Technologies Inc., San Diego, CA (US)

(72) Inventors: Robert J. Littrell, Boston, MA (US); Michael Carfore, North Quincy, MA (US); Shuwan Xue, Quincy, MA (US)

(73) Assignee: QUALCOMM Technologies, Inc., San Diego, CA (US)

( * ) Notice: Subject to any disclaimer, the term of this patent is extended or adjusted under 35 U.S.C. 154(b) by 0 days.

(21) Appl. No.: 17/819,855

(22) Filed: Aug. 15, 2022

(65) Prior Publication Data

US 2022/0394384 A1 Dec. 8, 2022

Related U.S. Application Data

(63) Continuation of application No. 16/819,665, filed on Mar. 16, 2020, now Pat. No. 11,418,882.
(Continued)

(51) Int. Cl.
*H04R 3/00* (2006.01)
*G01R 19/02* (2006.01)
(Continued)

(52) U.S. Cl.
CPC .............. *H04R 3/06* (2013.01); *G01R 19/02* (2013.01); *H04R 17/02* (2013.01);
(Continued)

(58) Field of Classification Search
CPC .... H04R 17/02; H04R 14/025; H04R 29/004; G10L 2025/786
See application file for complete search history.

(56) References Cited

U.S. PATENT DOCUMENTS

| 3,636,463 A | 1/1972 | Ongkiehong |
| 4,991,145 A | 2/1991 | Goldstein et al. |

(Continued)

FOREIGN PATENT DOCUMENTS

| CN | 103019373 A | 4/2013 |
| CN | 104050973 A | 9/2014 |

(Continued)

OTHER PUBLICATIONS

"Anetode, Headphone Reviews", head-fi.org [online], 2011, retrieved on Apr. 23, 2021, retrieved from URL https://www.head-fi.org/threads/why-does-it-matter-if-headphones-have-a-frequency-range-below-20hz-and-above-20khz.582802/, pp. 1-6.
(Continued)

*Primary Examiner* — Ryan Robinson
(74) *Attorney, Agent, or Firm* — QUALCOMM Technologies, Inc.

(57) ABSTRACT

A device that includes an adaptive acoustic detection circuit and an acoustic sensor device such as a microphone is described. The device includes in addition to the sensor a circuit configured to detect when an input stimulus to the sensor satisfies an adaptive threshold, and further configured to produce a signal upon detection that causes adjustment of performance of the device, wherein the adaptive threshold is a threshold value that varies over time in accordance with detected changes to sound of an environment in which the device is located.

17 Claims, 21 Drawing Sheets

Related U.S. Application Data

(60) Provisional application No. 62/818,140, filed on Mar. 14, 2019.

(51) Int. Cl.
  *H04R 3/06*     (2006.01)
  *H04R 17/02*    (2006.01)
  *H10N 30/30*    (2023.01)
  *H10N 30/80*    (2023.01)

(52) U.S. Cl.
  CPC ......... *H10N 30/302* (2023.02); *H10N 30/802* (2023.02); *H04R 2201/003* (2013.01)

(56) References Cited

U.S. PATENT DOCUMENTS

| | | | |
|---|---|---|---|
| 5,323,141 A | 6/1994 | Petek | |
| 5,644,308 A | 7/1997 | Kerth et al. | |
| 7,948,153 B1 | 5/2011 | Kellogg et al. | |
| 9,425,818 B1 | 8/2016 | Rajaee et al. | |
| 9,445,173 B2* | 9/2016 | Wiesbauer | H04R 19/005 |
| 9,799,337 B2* | 10/2017 | Chang | H04R 3/00 |
| 9,964,433 B2* | 5/2018 | Du | G10L 25/78 |
| 10,028,054 B2* | 7/2018 | Furst | H04R 3/04 |
| 10,715,922 B2 | 7/2020 | Littrell | |
| 11,418,882 B2 | 8/2022 | Littrell | |
| 2006/0195164 A1 | 8/2006 | Sondergaard et al. | |
| 2007/0129941 A1 | 6/2007 | Tavares | |
| 2010/0039923 A1 | 2/2010 | Kim et al. | |
| 2011/0142261 A1 | 6/2011 | Josefsson | |
| 2011/0233693 A1 | 9/2011 | Perruchot et al. | |
| 2012/0026716 A1 | 2/2012 | Bauer et al. | |
| 2012/0087521 A1 | 4/2012 | Delaus et al. | |
| 2012/0299937 A1 | 11/2012 | Brown et al. | |
| 2013/0101128 A1 | 4/2013 | Lunner et al. | |
| 2013/0110521 A1 | 5/2013 | Hwang et al. | |
| 2013/0132095 A1 | 5/2013 | Murthi et al. | |
| 2013/0195288 A1 | 8/2013 | Ye | |
| 2013/0223635 A1* | 8/2013 | Singer | H04R 1/1041 381/56 |
| 2014/0003630 A1 | 1/2014 | Demiya et al. | |
| 2014/0270197 A1 | 9/2014 | Krishnamurthy et al. | |
| 2014/0270259 A1 | 9/2014 | Goertz et al. | |
| 2014/0363010 A1 | 12/2014 | Christopher et al. | |
| 2015/0049884 A1 | 2/2015 | Ye | |
| 2015/0208165 A1 | 7/2015 | Volk et al. | |
| 2015/0215698 A1 | 7/2015 | Haiut | |
| 2015/0249881 A1 | 9/2015 | Ruan et al. | |
| 2015/0271606 A1 | 9/2015 | Grosh et al. | |
| 2015/0350774 A1 | 12/2015 | Fürst et al. | |
| 2015/0371638 A1 | 12/2015 | Ma et al. | |
| 2016/0066113 A1 | 3/2016 | Elkhatib et al. | |
| 2016/0314805 A1 | 10/2016 | Mortazavi et al. | |
| 2017/0150254 A1 | 5/2017 | Bakish et al. | |
| 2017/0214968 A1 | 7/2017 | Braithwaite et al. | |
| 2017/0223450 A1 | 8/2017 | Paton Alvarez et al. | |
| 2017/0238106 A1 | 8/2017 | Theill | |
| 2017/0245076 A1 | 8/2017 | Kusano et al. | |
| 2018/0352356 A1 | 12/2018 | Amir | |
| 2020/0296530 A1* | 9/2020 | Littrell | H04R 17/02 |
| 2020/0336841 A1* | 10/2020 | Zeleznik | H04R 19/04 |
| 2020/0408799 A1 | 12/2020 | Littrell | |

FOREIGN PATENT DOCUMENTS

| | | |
|---|---|---|
| CN | 203882609 U | 10/2014 |
| CN | 104918178 A | 9/2015 |
| JP | 2015206974 A | 11/2015 |
| KR | 20140036790 A | 3/2014 |
| WO | 2017151650 A1 | 9/2017 |
| WO | WO-2017151650 A1 * | 9/2017 ............... H04R 3/00 |

OTHER PUBLICATIONS

CN Search Report in Chinese Application No. 201780026345.6, dated May 11, 2020, 2 pages.

Freedman D.S., et al., "An Analog VLSI Implementation of the Inner Hair Cell and Auditory Nerve Using a Dual AGC Model", IEEE Transactions on Biomedical Circuits and Systems, vol. 8, No. 2, Apr. 2014, pp. 240-256.

International Search Report and Written Opinion—PCT/US2020/022932—ISA/EPO—dated Jun. 18, 2020.

Supplementary European Search Report—EP20769298—Search Authority—The Hague—dated Nov. 8, 2022.

* cited by examiner

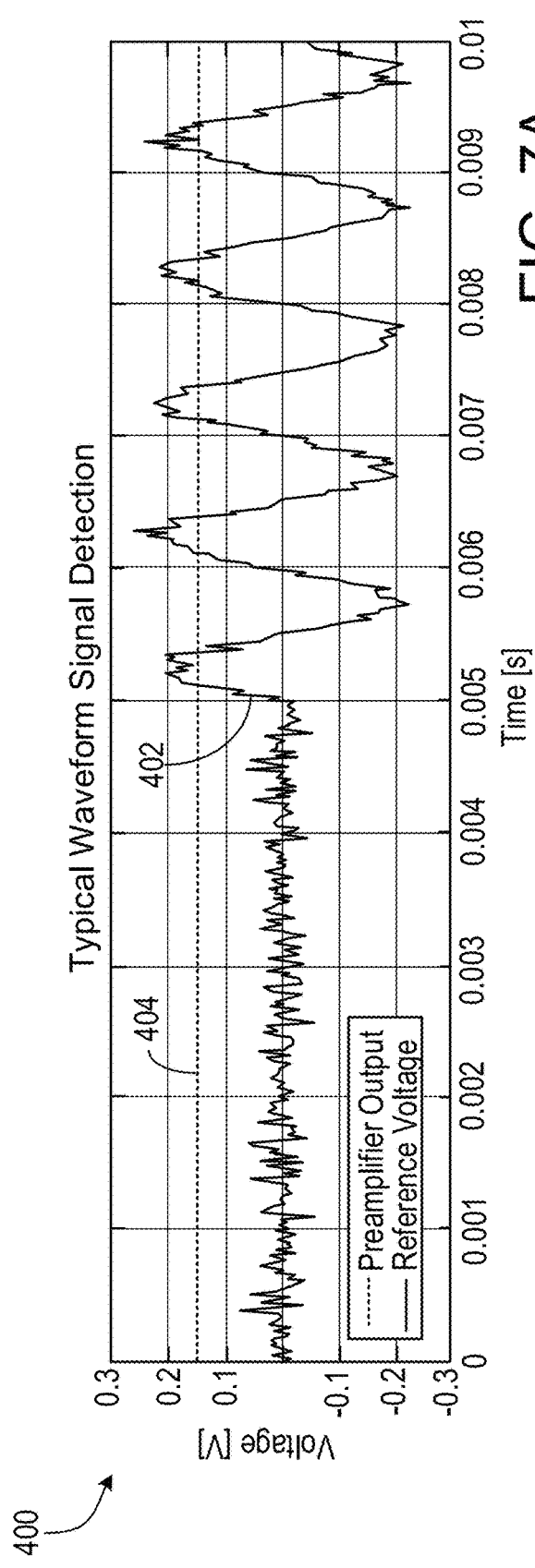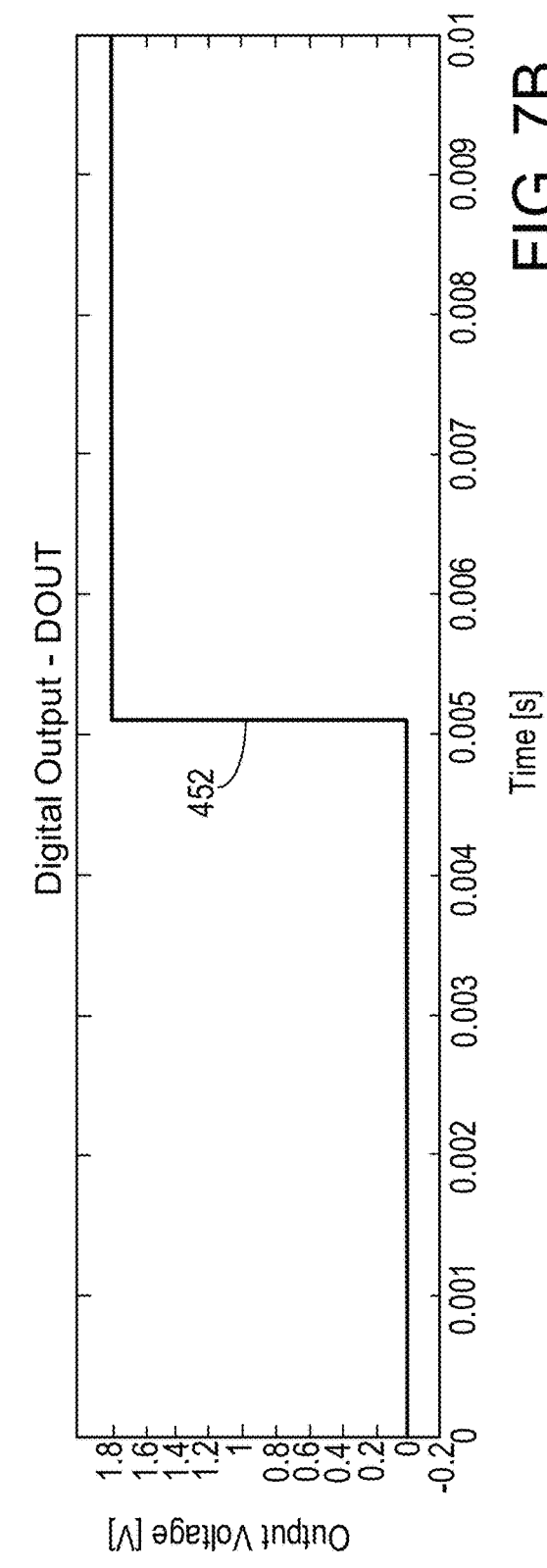

PIEZOELECTRIC MEMS DEVICE WITH AN ADAPTIVE THRESHOLD FOR DETECTION OF AN ACOUSTIC STIMULUS

CLAIM OF PRIORITY

The present application is a continuation of, and claims benefit under 35 USC 120 to, U.S. application Ser. No. 16/819,665, filed Mar. 16, 2020, which claims priority under 35 U.S.C. § 119(e) to U.S. Provisional Application No. 62/818,140 filed Mar. 14, 2019, the entire contents of which are incorporated herein by reference.

BACKGROUND

This disclosure relates to acoustic sensing and in particular use of sensors such as microphones, as used in voice activated devices such as smart speakers and other types of acoustic activated devices.

As the Internet of Things develops and more uses arise for acoustic activated devices, one of the challenges with acoustic activated devices is reducing power consumption. Generally, acoustic sensing devices sense acoustic signals (sound, vibration, etc.) that may occur over infrequent intervals. In order to address power consumption of acoustic activated devices one approach is acoustic wake-up detection. With acoustic wakeup detection, typically an acoustic detector circuit is included in the acoustic activated device, and remains in an active state consuming power while the remaining portion of the acoustic activated device is in an off or dormant state. Upon detection of an event by the acoustic detector circuit, the acoustic detector circuit generates a signal that causes power to be switched to the remainder of the acoustic activated devices. An acoustic detector circuit can also be an algorithm that is executed by a processor. Piezoelectric transducers are a type of electroacoustic transducer that convert electrical charges (e.g., produced by sound or input pressure) into energy.

SUMMARY

According to an aspect, a device includes a sensor element and a circuit configured to detect when an input stimulus to the sensor satisfies an adaptive threshold, and further configured to produce a signal upon detection that causes adjustment of performance of the device, wherein the adaptive threshold is a threshold value that varies over time in accordance with detected changes to sound of an environment in which the device is located.

Implementations can include one or a combination of two or more of the following features. The circuit can be a first circuit, and the device can further includes a second circuit for processing input following detection, where the second circuit is configured to increase its power level following detection, relative to a power level of the second circuit prior to detection. The device can be further configured to output data representing one or more sound levels prior to detection of the input stimulus that satisfies the adaptive threshold. The output data can represent multiple sound levels in frequency or time. The device can further include an amplifier circuit configured to track sub-threshold sound signals in the environment of the device, threshold sound signals in the environment of the device, and supra threshold sound signals in the environment of the device. The amplifier circuit can sum the sub-threshold sound signals in the environment of the device, the threshold sound signals in the environment of the device, and the supra threshold sound signals in the environment of the device.

In some implementations, the circuit can include an amplifier configured to apply a gain to the input stimulus to amplify the input stimulus, where the gain is the sum of the sub-threshold sound signals in the environment of the device, the threshold sound signals in the environment of the device, and the supra threshold sound signals in the environment of the device. The circuit can include a band pass filter bank including multiple filters to enable adaptation of the adaptive threshold in different frequency bands. The circuit can include a RMS to DC converter configured to receive the input stimulus and an amplifier configured to receive the input stimulus from the RMS to DC converter and to amplify the input signal in accordance with a background sound level. The circuit can be configured to detect sound signals in multiple frequency bands and further configured to detect when sound levels of at least a plurality of the sound signals in the multiple frequency bands increase or decrease over a specified amount of time, relative to sound levels of other sound signals detected at prior times. For example, the circuit can be configured to increase a value of the adaptive threshold when the sound levels of at least the plurality of the sound signals in the multiple frequency bands increase over the specified amount of time, with the increased value being in accordance with the detected increase, and to decrease a value of the adaptive threshold when the sound levels of at least the plurality of the sound signals in the multiple frequency bands decrease over the specified amount of time, with the decreased value being in accordance with the detected decrease. The adaptive threshold can be a non-fixed threshold. The device can be a microphone, an acoustic transducer, or a MEMS piezoelectric transducer.

According to an additional aspect, an adaptive acoustic detection circuit to detect when an input stimulus to a sensor satisfies an adaptive threshold, the detection circuit includes a band pass filter that receives an output from the sensor and a circuit fed from the band pass filter output and configured to detect when the output to the sensor satisfies an adaptive threshold and produce a signal upon detection that causes adjustment of performance of a device, with the adaptive threshold varying over time in accordance with detected gradual changes in stimuli in an environment in which the device is located.

Implementations can include one or a combination of two or more of the following features. The circuit can further include a converter circuit to convert the signal from the band pass filter circuit to a substantially DC signal, a fixed gain amplifier to amplify the substantially DC signal, a threshold circuit to establish a variable threshold level, and a comparator circuit having a first input fed by the amplified substantially DC signal and a second input fed by the variable threshold level for producing a detection signal according to a value of the amplified substantially DC signal relative to a value of the variable threshold level. The band pass filter, the converter, and the fixed gain amplifier can comprise a first channel of the circuit, and the circuit can further include at least one additional channel comprising a band pass filter, a converter, and a fixed gain amplifier, and a summing amplifier that receives outputs from the first channel and the at least one additional channel to provide an output that is fed to the first input. The band pass filter of the first channel and the band pass filter of the at least one additional channel can have different frequency pass bands.

In some implementations, the circuit further includes a variable gain amplifier having an input that receives the input signal, a control port and an output to provide an amplified output signal, a comparator circuit having a first input coupled to the output of the variable gain amplifier and a second input fed by a fixed threshold level signal for producing a detection signal according to a value of the amplified output signal relative to the fixed value of the threshold level, and a feedback circuit to produce a control signal that controls gain of the variable gain amplifier. The feedback circuit can include a rectifier to convert the signal at the input to the converter circuit to a substantially DC signal, an analog to digital converter to convert the substantially DC signal to a digital signal, and control logic that receives the digital signal and determines the value of the control signal fed to the control port of the variable gain amplifier. The feedback circuit can include a low pass filter coupled between the rectifier and the analog to digital converter. The circuit can further include a high pass filter and a low pass filter coupled in series between the output of the variable gain amplifier and the input of the comparator circuit.

According to an additional aspect, a method includes detecting when an input stimulus to a sensor of a device satisfies one or more detection criteria, where at least one of the one or more detection criteria comprises an adaptive threshold value that varies over time in accordance with detected changes to sound of an environment in which the device is located, producing a signal upon detection that causes adjustment of performance of the device by causing a circuit of the device to increase its power level, relative to a power level of the circuit before detection and processing input to the device using the circuit with the increased power level.

Implementations can include one or a combination of two or more of the following features. Data representing one or more sound levels in the environment in which the device is located can be received, and the adaptive threshold value can be adjusted based at least in part on the one or more sound levels and data representing previously detected sound levels in the environment of the device. The one or more sound levels can include average sound levels in the environment of the device over a specified amount of time. The one or more sound levels can include a first sound level corresponding to a first frequency band and a second sound level corresponding to a second frequency band, the first frequency band and the second frequency band comprising different frequencies. The adaptive threshold value can be increased when at least one of the one or more sound levels increases over a specified amount of time, relative to the previously detected sound levels in the environment of the device, where the increase of the adaptive threshold value corresponds to the detected increase of the at least one of the one or more sound levels. The adaptive threshold value can be decreased when at least one of the one or more sound levels decreases over a specified amount of time, relative to the previously detected sound levels in the environment of the device, wherein the decrease of the adaptive threshold value corresponds to the detected decrease of the at least one of the one or more sound levels. The data representing the one or more sound levels can be received before detecting the input stimulus. The device can include a microphone, an acoustic transducer or a MEMS piezoelectric transducer.

Piezoelectric Micro Electro-Mechanical Systems (MEMS) devices have an inherent ability to be actuated by stimulus even in the absence of a bias voltage enabling such to piezoelectric devices to provide ultra-low power detection of a wide range of stimulus signals. Piezoelectric MEMS Microphones can take advantage of this effect and can be included in circuits that will produce signals based on a prescribed minimum (fixed) acoustic input level indicating an acoustic stimulus (of significance) was detected to perform further actions by such circuits, i.e., mode to a higher performance state, turn on other components within a system, begin a digital acquisition to further investigate acoustic stimulus etc.

Use of a fixed acoustic input level can result in poor performance in very noisy environments (because the background noise is likely to consistently be above the threshold, resulting in the device consistently consuming power) and very quiet environments (where a natural voice level is unlikely to rise above a threshold level).

The adaptive acoustic level (e.g., threshold) circuits according to the above aspects provide for greater accuracy in stimulus detection by increasing the threshold in a noisy environment and decreasing the threshold in a quiet environment. The threshold for the environment can be related to an average value of background noise of an environment in which a device is located or can be proportional to an average value of background noise or can be defined as the noise level above which the device signals the system.

Such piezoelectric MEMS transducer devices can be used in adaptive wake-on-sound signal detection circuits for such electronic devices including virtual digital assistant devices, smart speakers, remote controls, security cameras, headphones, cellphone microphones, etc., when the transducer devices are used as a microphone. Alternatively, the transducer devices can be sensor devices that sense other physical quantities, e.g., heat, vibration, etc. Rather than having a preset and fixed threshold an adaptive threshold adjusts to a background level, such that the detection circuit detects "relevant" events that are distinct from background noise.

Aspects include corresponding computer systems, apparatus, computer programs products recorded on one or more computer storage devices, and methods.

The details of one or more embodiments of the disclosure are set forth in the accompanying drawings and the description below. Other features, objects, and advantages of the disclosure will be apparent from the description and drawings, and from the claims.

DESCRIPTION OF THE FIGURES

FIGS. 7A-7B are graphs showing waveform input to and output signal from detection circuitry.

DETAILED DESCRIPTION

Figure 1:
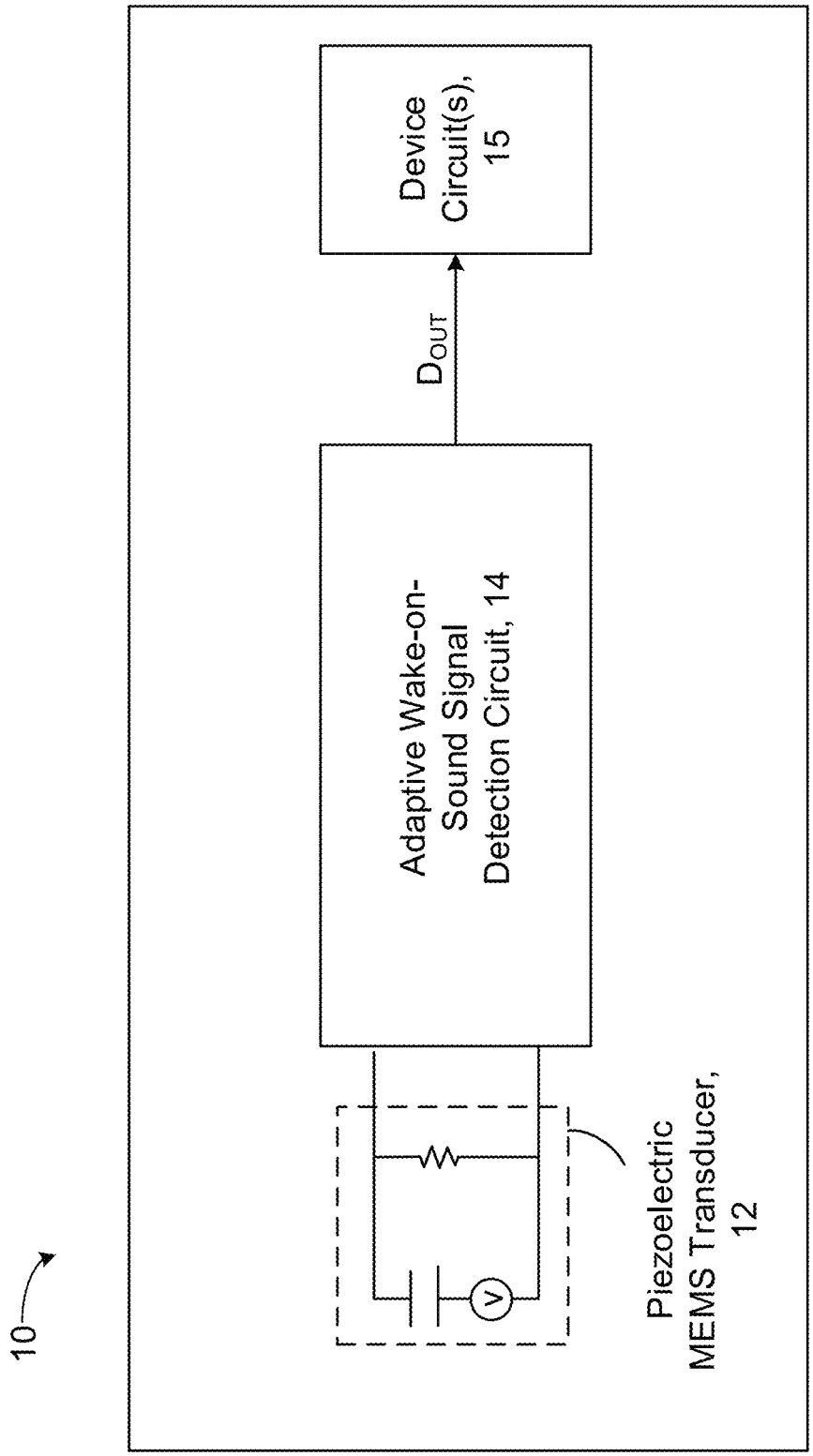
FIG. 1 is a block diagram of a device/system having an adaptive wake on sound detection circuit.

Piezoelectric Micro Electro-Mechanical Systems (MEMS) devices have an inherent ability to be actuated by stimulus even in the absence of a bias voltage for the transducer due to the piezoelectric effect of the material used to realize the transducer, e.g., AlN, PZT, etc. This physical property enables piezoelectric MEMS devices to provide ultra-low power detection of a wide range of stimulus signals, and provide deeper integration of the detection electronics within an application-specific integrated circuit (ASIC) without requiring specialized electronics at the system level or add-on blocks that do not optimize the power performance of the transducer.

MEMS capacitive microphones require a charge pump to provide a polarization voltage to the back-plate. Charge pumps require a clock and storage capacitors to store charge that is pumped onto the back-plate. Multiple stages are required to boost the polarization voltage to required levels. When initially turned on, time is required to achieve desired levels based on clock frequency, storage capacitor size, and available supply voltage.

Piezoelectric MEMS devices do not require a charge pump. Furthermore, the charge generated by the piezoelectric effect is always being generated due to stimulus causing mechanical stress. As a result, ultra-low power circuits can be utilized to transfer this charge to a voltage and provide an output relative to the mechanical stress induced on the Piezoelectric MEMS device through simple gain circuits. Higher voltages are not required to achieve higher transducer sensitivity.

One particular application, utilizing Piezoelectric MEMS Microphones and taking advantage of this effect, is a circuit that will produce a signal based on a prescribed minimum (fixed) acoustic input level indicating an acoustic stimulus (e.g., a keyword or phrase) was detected. This signal could be further utilized by the system and/or microphone to perform further actions, i.e., mode to a higher performance state, turn on other components within the system, begin a digital acquisition to further investigate the acoustic stimulus and identify its components.

Use of a minimum, fixed acoustic input level can result in poor performance in very noisy environments (because the background noise is likely to consistently be above the threshold, resulting in the device consistently consuming power) and very quiet environments (where a natural voice level is unlikely to rise above a threshold level).

Rather than having a fixed acoustic input level, an adaptive acoustic level (e.g., threshold) provides for greater accuracy in stimulus detection by increasing the threshold in a noisy environment and decreasing the threshold in a quiet environment. As described herein, in some implementations of FIG. 2, the threshold can be related to an average value of background noise of an environment in which a device is located. In other implementations, such as some versions of FIG. 2, as well as FIG. 3, the threshold can be proportional to an average value of background noise. In the example of FIG. 3, the threshold can be approximately 4.6 times the average value. Alternatively, the threshold can be defined as the noise level above which the device signals the system (or changes the value of $D_{OUT}$).

Referring to FIG. 1, an electronic device (or system) 10 is shown to include a piezoelectric MEMS transducer device 12 ("transducer device 12"), more specifically, a piezoelectric MEMS microphone. The transducer device 12 is coupled to an adaptive wake-on-sound signal detection circuit 14 ("detection circuit 14"), which is coupled to device circuits 15 that may include electronics for processing sound. The electronic device 10 can be any type of electronic device that would use a transducer device 12. Non-limiting examples of such electronic devices 10 include virtual digital assistant devices such as Alexa® (Amazon, Inc.) and Echo® (Amazon, Inc.) smart speakers, remote controlled security cameras, headphones, cellphone microphones, etc. Detection circuit 14 detects an input stimulus and outputs a signal, Dout, that causes device circuits 15 to power on. In this example, detection circuit 14 is configured to detect input stimulus based on an adaptive threshold that increases or decreases in accordance with a sound level of an environment.

The detection circuit 14 provides a floating or dynamic threshold signal level (corresponding to a sound level) at which the device 10 (FIG. 1) will adjust operation from a lower power level (sleep state) to a higher power level (wake state) in which the device 10 performs voice signal processing or speech detection, etc. based on acoustic signals received by the transducer device 12, e.g., when used as a microphone. Alternatively, the transducer device 12 can be a sensor device that senses other physical quantities, e.g., heat, vibration, etc.

Rather than having a preset and fixed sound level threshold (for transitioning the device 10 from the lower power level to the higher power level), detection circuit 14 has an adaptive threshold that adjusts to a background sound level, such that the detection circuit 14 detects "relevant" auditory events, e.g., those events that are distinct from background noise. When a detector operates with a fixed threshold level, such a detector would be unable to adjust to changes in background noise, causing decreased accuracy in detecting relevant auditory events especially in environments with very loud and very quiet background noise signatures and/or in environments that vary between very loud and very quiet background noise signatures.

In a loud noise environment, the transducer device 12 (e.g., a microphone) receives sound inputs and a detection circuit 14 produces signals that cause device circuits 15 to power on. When detection circuit 14 consistently detects the presence of input stimuli (due to the loud noise environment), device circuits 15 always stay in an awake mode, making the device (or system) 10 consume power, while there is an absence of input stimuli of real significance, e.g., inputs such as human voice commands. In a quiet environment, often the natural voice level does not wake up the device (or system) 10, making the device (or system) 10 appear unresponsive to users. Through use of the detection circuit 14 having an adaptive threshold, the device (or system) 10 avoids remaining in a high power mode in high noise environments and yet missing relevant input stimuli, e.g., sounds in low acoustic level environments.

Figure 2A:
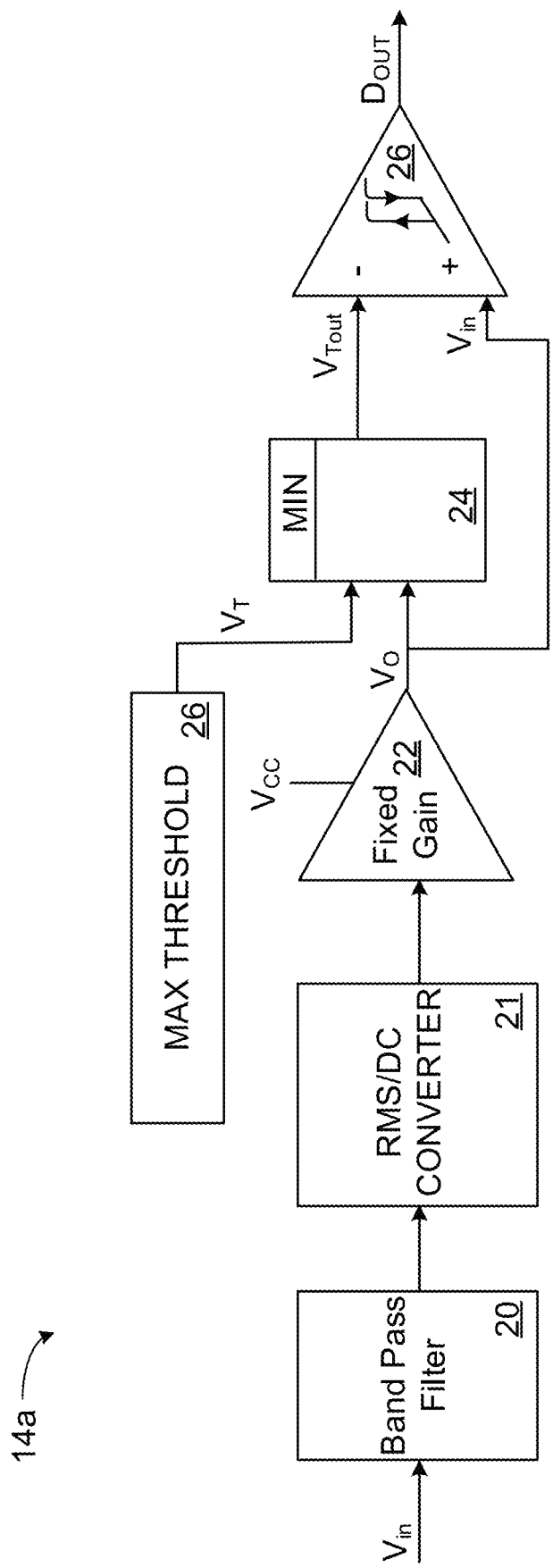
FIGS. 2A, 2B, 2C and 3 are block diagrams of adaptive detection circuits.
Figure 3:
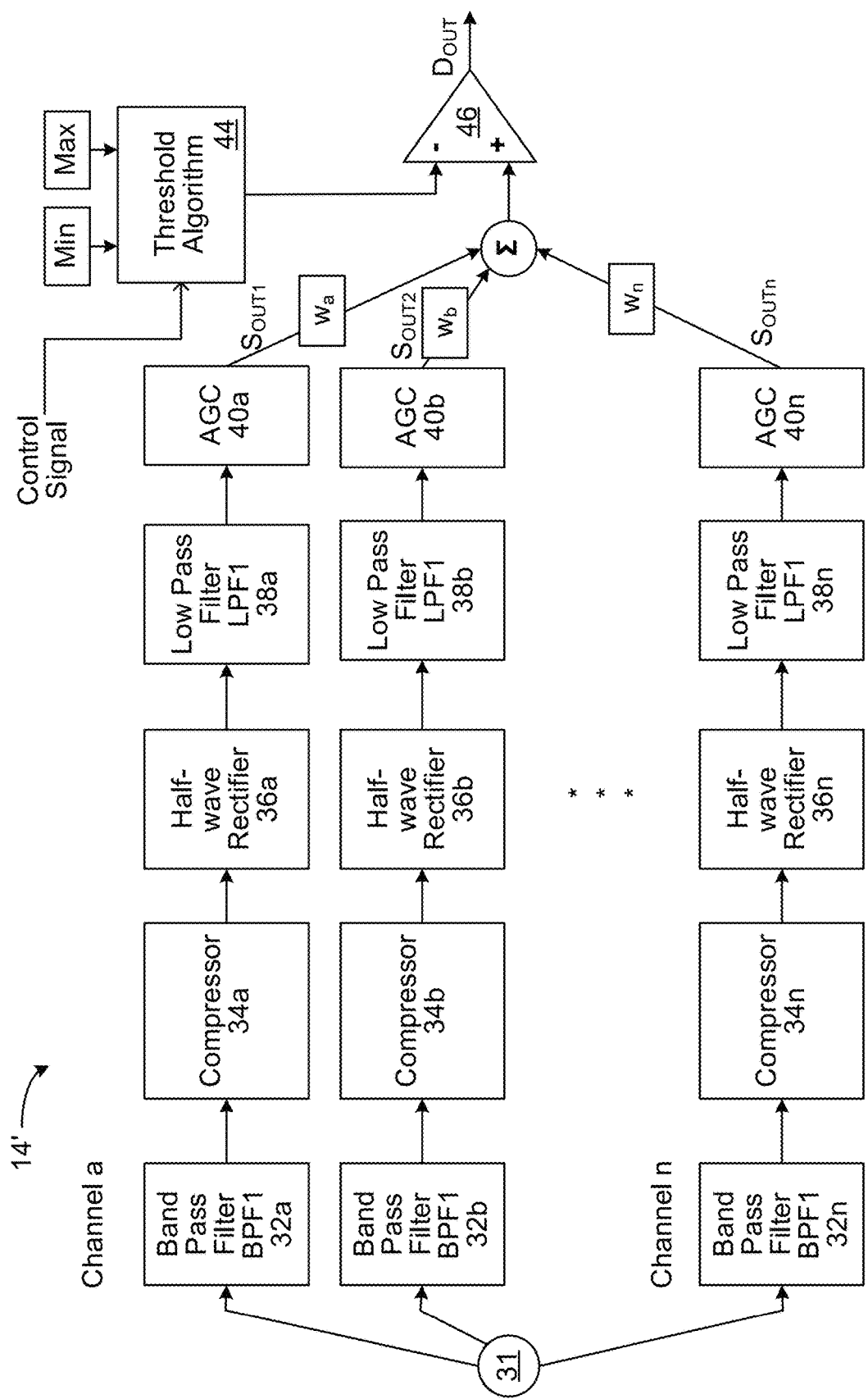

Referring to FIG. 2A, the detection circuit 14 is shown. The detection circuit 14 is an adaptive detection circuit that enables adaption of signal levels (representative of sound). A version of this detection circuit that enables adaption of signal levels to different power levels in different frequency bands will be described in FIG. 3.

The detection circuit 14 includes a band pass filter 20 and a root mean square (RMS)/direct current (DC) converter 21 that receives an input signal, $V_{in}$, e.g., produced as an output voltage signal from the transducer device 12, such as a microphone. The RMS/DC converter 21 converts $V_{in}$ to a DC signal level and feeds this DC signal to an amplifier circuit 22 to increase (or amplify) the amplitude of the DC signal by a specified amount.

The amplified DC signal $V_O$ is input into logic circuit 24, which is configured to select a minimum value of inputs. Another signal 26 representing a max threshold value is also input into logic circuit 24. The max threshold value is a pre-specified, fixed threshold value or can be (that can be calculated using the approach discussed below see FIG. 5A etc.) Logic circuit 24 selects between the minimum (or lower value) of amplified DC signal ($V_o$) and the max threshold $V_{Tout}$ to provide signal, as the threshold sound level, $V_{Tout}$. By doing so, detection circuit 14 implements an adaptive threshold that increases as the background sound level increases and decreases as the background sound level decreases. Thus, the detection circuit 14 enables the device to detect relevant auditory events in a noisy background sound level (without the system 10 that includes detection circuit 14 remaining in a higher power mode) and in a quieter background sound level.

Detection circuit 14 also includes a comparator 26 (e.g., a latched comparator) that compares $V_{in}$ to $V_T$. The output ($D_{OUT}$) of comparator 26 is processed by the system 10 that includes detection circuit 14 to determine whether to transition the system 10 from lower power to higher power modes. Determination of min and max threshold values can be adapted from the principles discussed below.

In each of the examples of FIGS. 2A-3, the comparator (e.g., comparator 26), compares an un-buffered signal that is pseudo "live" signal to the threshold. Typically a digital implementation would buffer some amount of data, and thus digital implementations would not need to be fast and thus such digital implementations can partition the digital data into windows (for example, 20 msec. of data per window) and compare average energy levels in a current window to an average of energy levels over several prior windows. In an analog implementation without buffering data, a 20 msec. delay may be too long of a delay. Therefore, the analog implementation needs to be faster than an equivalent digital implementation. Therefore, these circuits of FIGS. 2A-3 compare actual sound pressure waveforms (which may include filtered versions of the sound pressure waveforms) to the threshold. This way, the system of FIG. 1 would be fast enough to wake up and catch the wake-word (or other significant event).

In some examples, the detection circuit 14 also outputs signals representing one or more sound levels prior to detection of the input stimulus that satisfies the adaptive threshold in different frequency bands. For example, the system 10 may be configured to report out to one or more external systems a background sound level (or energy) prior to the detection circuit 14 detecting the input stimulus and the system 12 powering on.

Figure 2B:
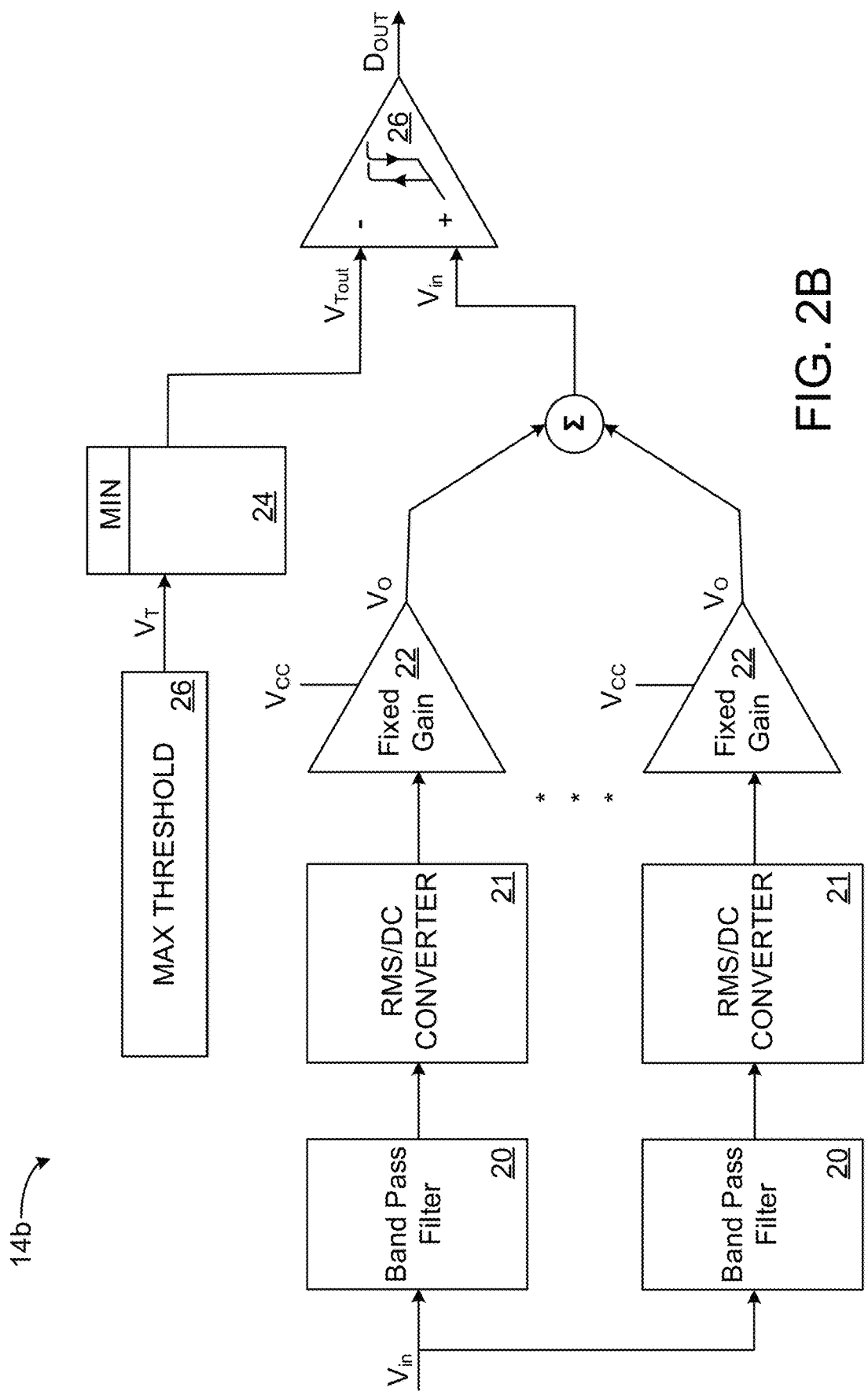

Referring now to FIG. 2B, an alternative detection circuit 14b is shown. The detection circuit 14b is configured to include plural channels 11a-11n corresponding to the detection circuit 14a (of FIG. 2A) and also includes a summing amplifier 30 that sums input signals from the plural channels 11a-11n (each including a respective band pass filter 20, root mean square (RMS)/direct current (DC) converter and amplifier circuit 22, as above) to provide a summed Vin signal that is compared to a threshold value.

Figure 2C:
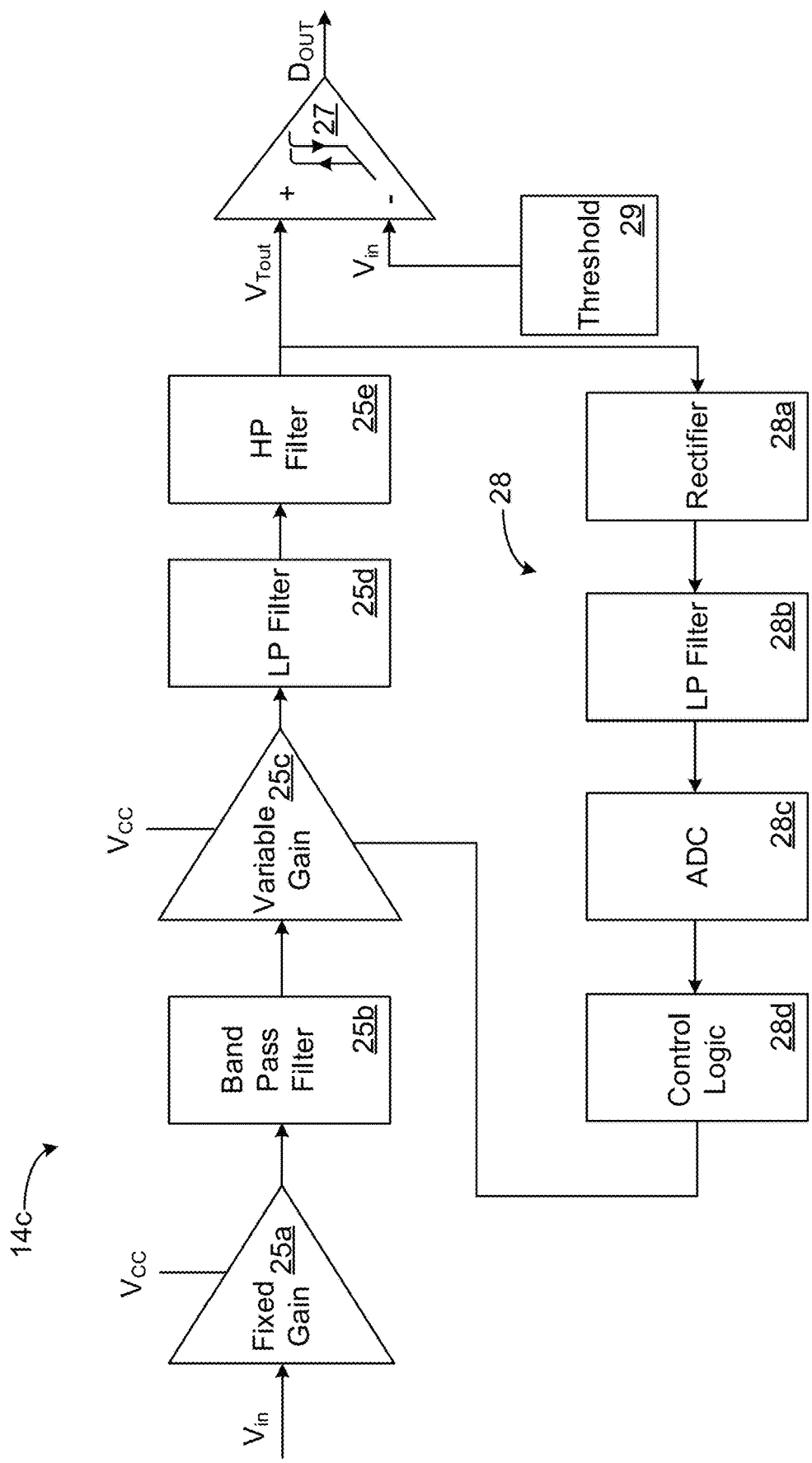

Referring to FIG. 2c, another alternative detection circuit 14c is shown. The detection circuit 14c is an adaptive detection circuit that adapts thresholds to changes in input signal levels (e.g., representative of sound or other acoustic inputs). This detection circuit 14c is dynamically adaptive similar to detection circuits 14a-14b of FIGS. 2A, 2B, but functions in a different way to detect sound or acoustics. The alternative detection circuit 14c includes an amplifier 25a with a fixed amount of gain that is fed an input signal (e.g., from an input sensing device, such as a microphone) that is amplified by a nominal gain amount. The amplified signal is fed to a high-pass filter 25b to filter out unwanted DC offset voltages and to remove very low frequency components that are not of interest. The high-pass filter 25b output feeds a variable gain amplifier 25c that has an input, an output and a control input. The output of the variable gain amplifier 25c is an amplified signal. The gain imparted to the output signal from the variable gain amplifier 25c is controlled by a control signal provided from a feedback loop 28.

The output amplified signal from the variable gain amplifier 25c is coupled to a low pass filter 25d and a high pass filter 25e that are placed together to form a band pass filter. These filters 25d, 25e if needed, remove an unwanted DC offset and can be used to filter out unwanted parts of the signal depending on the application. This signal is fed to, e.g., the positive input of a comparator 27 and is compared to a fixed threshold value 29 that is at the e.g., negative input of the comparator 27. Although the signal is compared to a fixed value in this case, the threshold is effectively floating because the gain imparted to the signal that is at the output of the amplifier 25c is controlled by the feedback loop 28 that includes a rectifier circuit 28a, another low pass filter 28b, an analog to digital converter 28c, e.g., a three-bit analog to digital converter, and control logic 28d that produces the control signal to control the gain of the variable gain amplifier 25c.

The feedback loop 28 is coupled to the input to the comparator 27, as shown. This signal is fed to the rectifier 28a and the rectified signal from the rectifier 28a is fed to the low pass filter 28b (performing the function of the RMS/DC converter in FIG. 2A), to provide a pseudo-RMS (root mean square) output signal value. This pseudo-RMS output signal is fed into the 3-bit ADC 28c to provide a digital output of three bits that is used to determine if the signal level into the input terminal to the comparator 27 is too high, too low, or within a set range. This digital output is fed to control logic 28d and the control logic determines the status of the input signal level. If the input signal to the comparator is too low, the ADC output is low and this causes the control logic to produce the control signal that is fed to the variable gain amplifier 25c to increase the gain of the variable gain amplifier 25c. If the input signal to the comparator is too high, the ADC output is high and this causes the control logic produce the control signal that is fed to the variable gain amplifier 25c to decrease the gain of the variable gain amplifier 25c. If the signal is at the appropriate level, the control logic does not change the gain of the variable gain amplifier 25c.

Due to the circuit timing, the control logic operates slowly and only changes the gain at, for example, half second intervals (or other time increments). Therefore, the gain only responds to slow changes in input signal levels. This feedback loop 28 controls the gain such that the RMS level into the comparator 27 is approximately constant. Further, the value of the gain in the variable gain block is an indication of the sound level. This can be communicated out of the circuit 14c in order to provide an indication of sound level prior to a change in $D_{OUT}$.

Referring now to FIG. 3, an alternative adaptive detection circuit 14' is shown to include plural channels, e.g., channel_a to channel_n. The channel_a to channel_n ($CH_1$-$CH_n$) each are fed the input signal from the input 31, and the channels $CH_1$-$CH_n$ each include one of band pass filters 32a-32n, respectively, e.g., multiple band pass filters disposed between the transducer device 12 (e.g., the microphone FIG. 1) and the input 31 to the detection circuit 14'. The band-pass filters (BPF's) 32a-32n are each tuned to a specific frequency band (e.g., configured according to human hearing 20 Hz. to 20,000 Hz). The detection circuit 14' has the plural channels CHa-CHn and each channel provides an output signal.

The plural channels CHa-CHn include signal compressors 34a-34n, half wave rectifiers 36a-36n, low-pass filters 38a-38n and AGC circuits 40a-40n. In some implementations, as shown are weighting circuits $w_a$-$w_n$ that can be used to weight individual contributions from each channel according to specific needs of a given application of the detection circuit 14'. The signal compressors 34a-34n, compress the signals output from the respective band pass filters 32a-32n, whereas the half wave rectifiers 36a-36n convert the compressed band-passed input signals to DC values enabling additional signal compression and envelop tracking. The low pass filter can filter out higher frequency components, especially those which would be outside of a frequency band for envelop tracking of input stimuli of real significance, e.g., inputs such as human voice commands. The amplifier circuit 40a will enable tracking of sub-threshold activities, as well as threshold crossing activities. In one embodiment the AGC 40a is of the type described in "An Analog VLSI Implementation of the Inner Hair Cell and Auditory Nerve Using a Dual AGC Model," IEEE TRANSACTIONS ON BIOMEDICAL CIRCUITS AND SYSTEMS, VOL. 8, NO. 2, APRIL 2014, the entire content of which is incorporated herein by reference. In this description all of the circuits disclosed operate in the analog domain. However, digital signal processing equivalents of these circuits could be an alternative implementation, and which would operate in the digital domain. The threshold is nominally a fixed value that can float or change gradually between the min and max limits. Min and max thresholds are determined empirically such as from tuning of the circuits 32-40. The summer device can be implemented as a common operational amplifier.

The detection circuit 14' also includes a threshold circuit 44 that implements a threshold algorithm to adapt an output threshold signal between a "min" value and a "max" value providing a reference value to a comparator 46, e. g., a latching comparator. The detection circuit 14' has an input that receives a control signal that is used to adjust or adapt the threshold between the "min" value and the "max" values (which can be fixed values or variable values) to provide at an output the reference value to the latching comparator 46. In one implementation, the input control signal that adapts the output threshold occurs by feeding the input to the threshold circuit 44 from the output of the summer 42. In another implementation, the signal is provided by a processor (not shown) that can be part of the wake up circuitry and/or the circuitry of the device 10.

The latching comparator 46 is fed by the input signals from the input 31 that were aggregated via the summer 42 (or individual ones of those signals) to cause the comparator 46 to switch states of a wake up signal according to the relative values of the input signal at the +input to the comparator 46 and threshold signal at the −input to the comparator 46. When the comparator 46 has the input signal at input +which is at or above the threshold at—the comparator will trigger a high state for signal $D_{OUT}$ that can be used as a wake signal to other circuitry in the device/system 10.

In the detection circuit 14', each channel $CH_a$-$CH_n$ is configured to detect stimuli inputs in a frequency band specified for that channel, e.g., based on the detected frequency of $V_{in}$ for that channel. The channels CHa-CHn provide output signals $S_{OUT1}$ to $S_{OUTn}$. These signals can be aggregated via summer 44 (e.g., an operational amplifier) to provide $D_{OUT}$. (Alternatively, individual ones of the signals $S_{OUT1}$ to $S_{OUTn}$ could be used to wake up the device/system 10 circuitry provided the circuit also had multiple comparators not shown). These signals $S_{OUT1}$ to $D_{OUTn}$ could be used collectively for processing of audio information. The bandpass filter bank with the multiple filters are each tuned to a specific frequency band which enables adaptation of the detection circuit 14' to different frequency bands.

In the embodiment of FIG. 3, the circuits 32-40 provide specially tuned spike rate functions that can be summed together at summing device 44 for all sub-threshold and supra-threshold activities from all of the channels to provide the wake-on-sound trigger signal to the system 10.

Figure 3A:
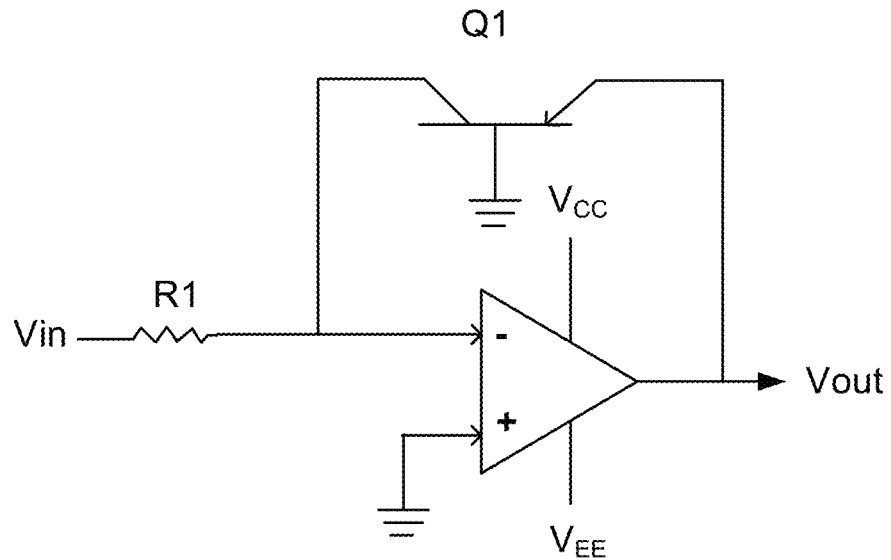
FIGS. 3A and 3B are block diagrams of circuits used in FIGS. 2A, 2B and 3.
Figure 3B:
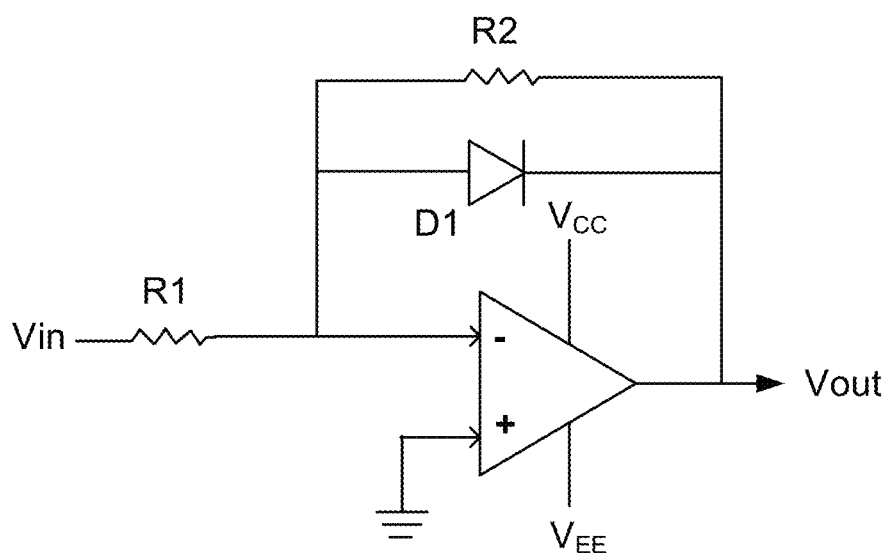

FIG. 3A shows a transistor implemented logarithmic amplifier that can be used as the compressor circuits 34a-34n. FIG. 3B shows an implementation of the half wave rectifiers 36a-36n. These are merely illustrative examples for implementing these circuits 34a-34n and 36a-36n that can be used.

Figure 4A:
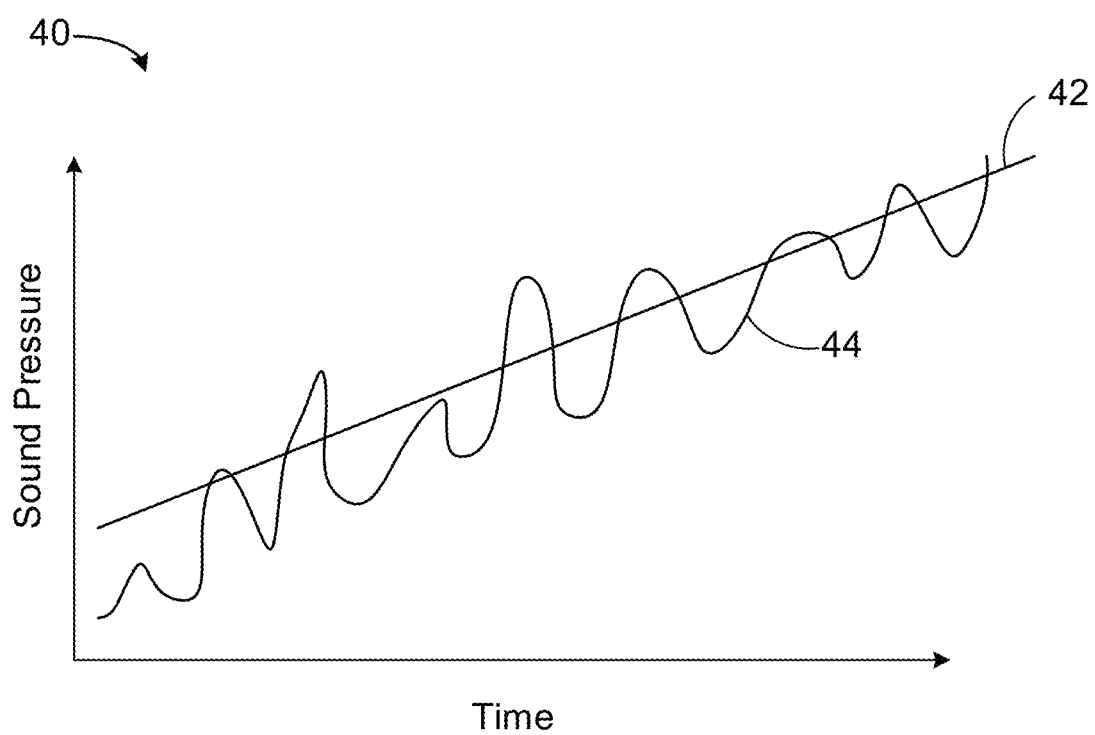
FIGS. 4A-4D are plots of sound pressure level vs. time for various scenarios.

Referring to FIG. 4A, plot 40 illustrates how adaptive threshold 42 increases (over time) as the sound level (represented by waveform 44) increases over time in a particular environment. In this example, adaptive threshold 42 is based on a history of sound in the particular environment. As such, adaptive threshold 42 adjusts in accordance with the sound of the environment (e.g., the background sound level in the environment). As described herein, the adaptive threshold can be implemented in analog circuits to achieve lower system power consumption (e.g., relative to system power consumption with a fixed threshold). These adaptive thresholds can also be implemented in a microphone's Application Specific Integrated Circuits (ASIC's) (whether digital or analog circuitry) to achieve low system power use and flexibility, relative to system power use and flexibility of a wake up circuit with a fixed threshold. As further described herein, the energy level prior to "wake-up" (e.g., the device being powered on) can be communicated to the rest of the system.

Figure 4B:
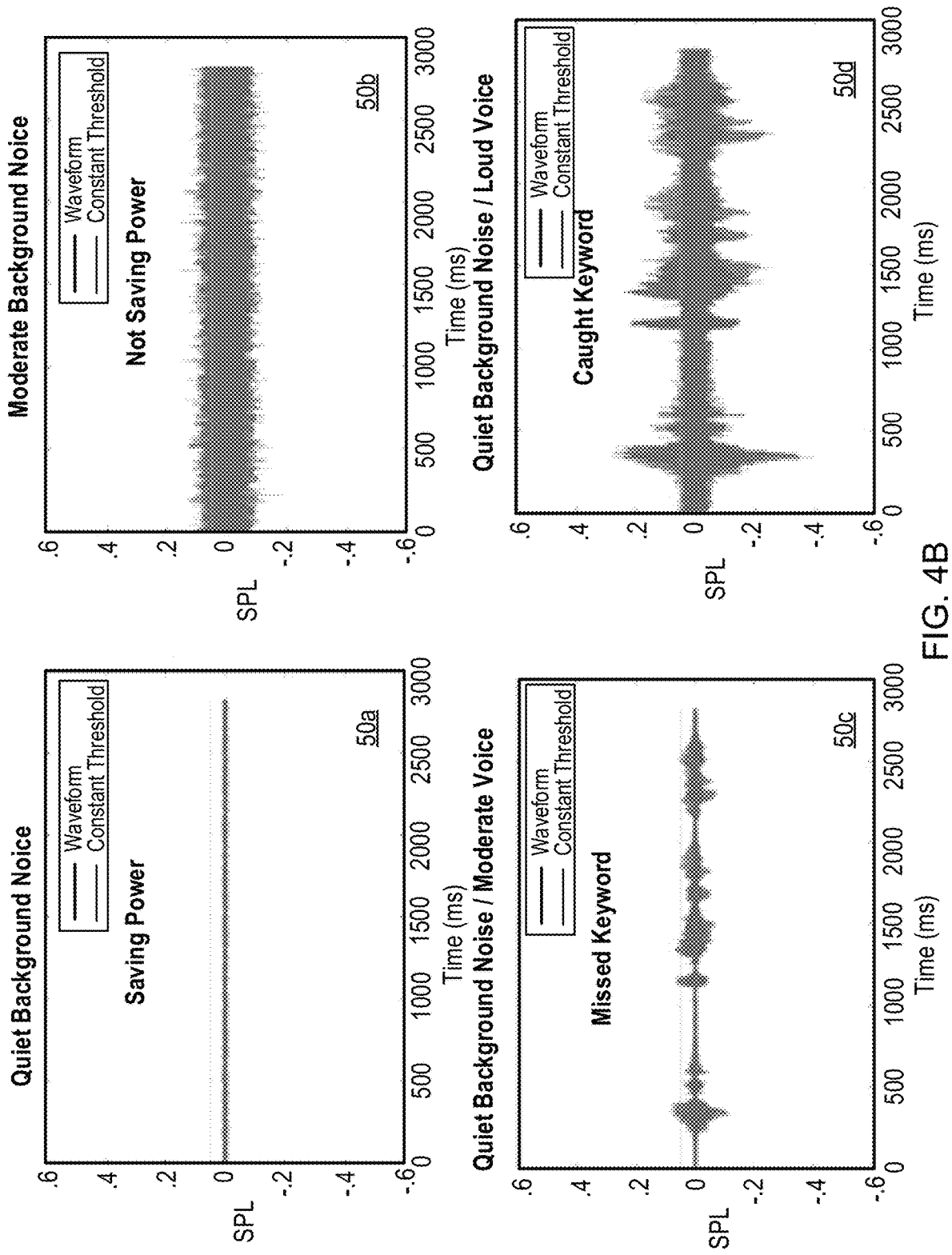

Referring to FIG. 4B, plots 50a-50d show a sound waveform of a person speaking. The red (or dashed) line represents a threshold. Whenever the waveform exceeds the threshold, the microphone stays on for some period of time to ensure that the entire utterance is captured. Plot 50a illustrates quiet background noise without voice. Plot 50b illustrates moderate background noise without voice. Plot 50c illustrates quiet background noise (~45 dB) and moderate voice level (~65 dB). Plot 50d illustrates moderate background noise (~60 dB) and loud voice level (~75 dB).

In a device that implements a fixed threshold, the device performs as follows: When background noise is quiet (as shown in plot 50a) or when voice is loud (as shown in plot 50d), the performance is as desired. Without voice, power is saved (as shown in plot 50a). With voice, the keyword is caught, as shown in plot 50d.

However, if the voice is at just the moderate level, the keyword is missed, as shown in plot 50c. The keyword is missed because the threshold is not exceeded until the middle of the first word instead of the beginning of the first word. If the background noise is moderate, then the system does not save any power, as shown in plots 50b. This is because the threshold is exceeded with the noise alone. These last two outcomes (depicted in plots 50b, 50c) are undesirable. Rather, than having a fixed threshold, a threshold that is a function of the past background noise level is adaptive and enables detection of voice stimuli when the voice is at a moderate level and also enables the saving of power when the background noise is moderate.

Figure 4C:
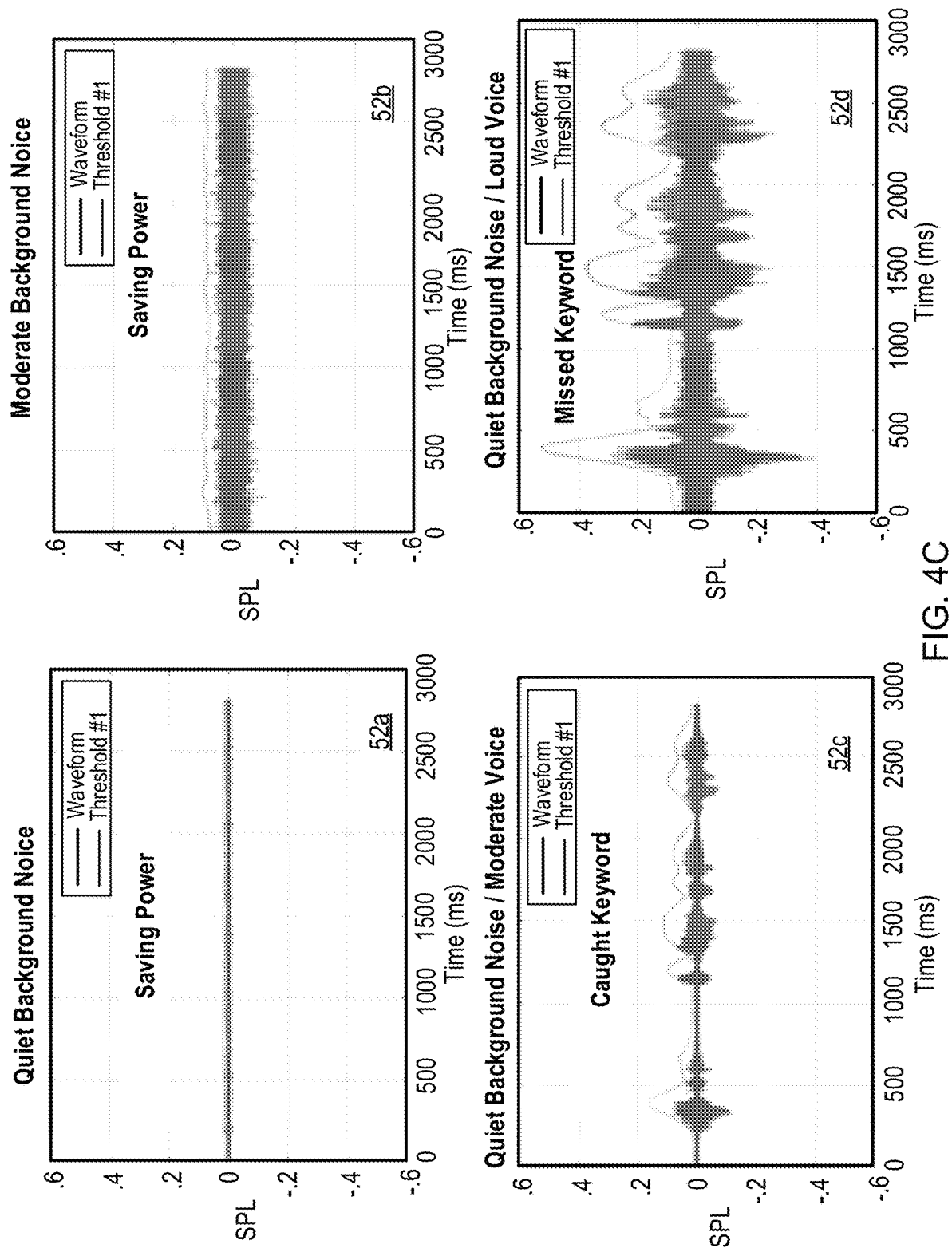

Referring to FIG. 4C, plots 52a-52d provide examples of such adaptive threshold. In each of these examples, the threshold (red line) is created by taking the RMS value of the previous 100 ms of audio and multiplying that value by 4.6. This threshold is referred to herein as "Threshold #1." In these four examples, the behavior is as desired in 3 of the 4 scenarios, as shown in plots 52a-52c. When there is no voice present, power is saved in both cases because the threshold scales with the noise—as shown in plots 52a-52b. When voice is present, the keyword is caught for the more quiet case because the voice signal to noise ratio (SNR) is better, as shown in plot 52c. The keyword is missed in the case of louder background noise because the SNR is slightly worse, as shown in plot 52d.

Figure 4D:
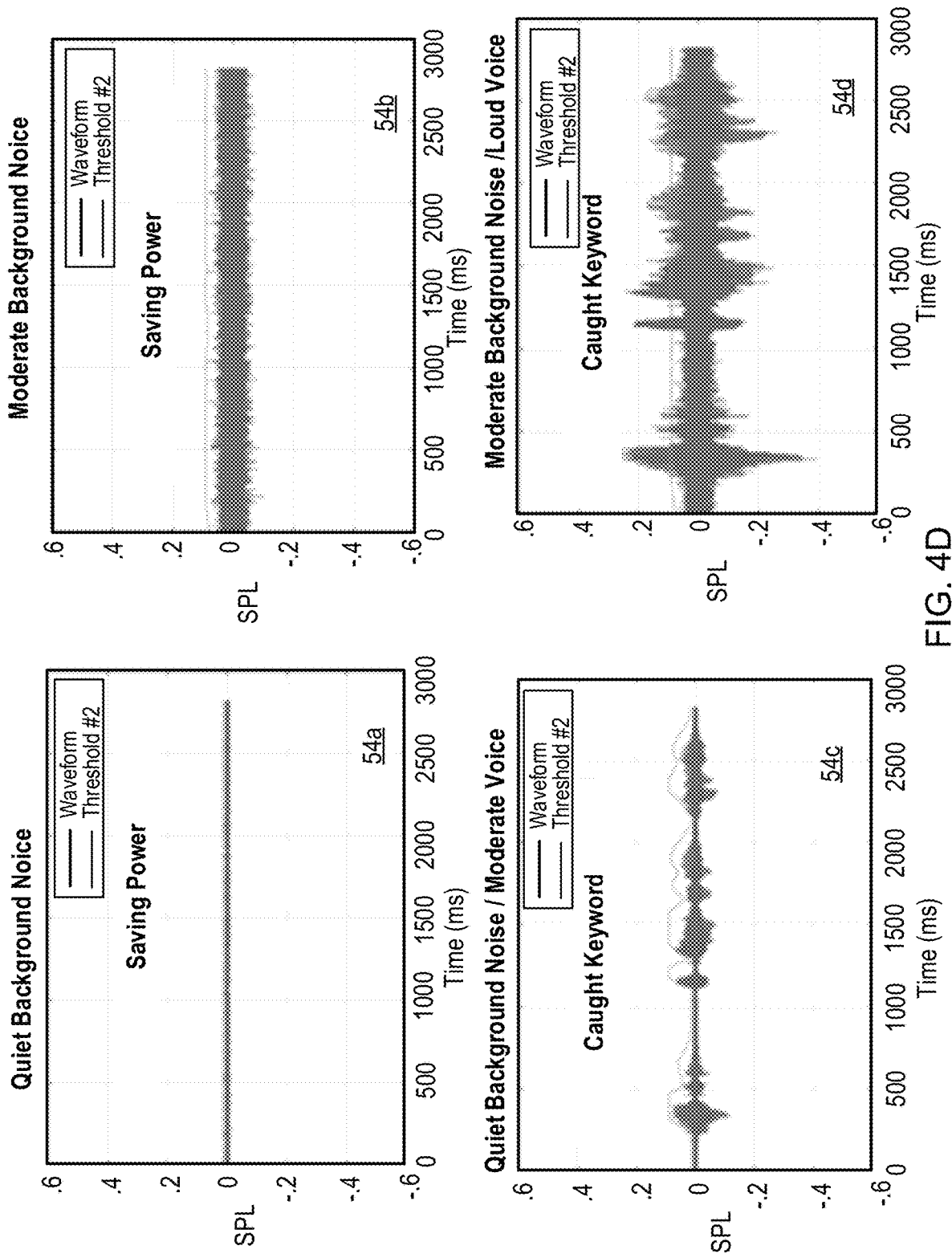

Referring to FIG. 4D, a non-linearity is added to the threshold depicted in FIG. 4c to ensure good performance in the above described scenarios, as shown in plots 54a-54d. In these example, the threshold the minimum of the RMS value multiplied by 4.6 and a fixed value, such as 0.09 Pa. The resultant threshold achieves the desired outcomes in the above described scenarios, as shown in plots 54a-54d. Further refinement of the algorithm is possible and these specific levels are just given as an example. However, the adaptive threshold described herein scales with an input and a non-linearity to address loud background noise/poor SNR.

The above implementations use an auditory model to set an adaptive wake on signal threshold of a sensor device, e.g., a microphone. The adaptive auditory model discussed above can be implemented in analog circuits to achieve very low power consumption or also can be implemented in a microphone's digital ASIC circuits to achieve low power consumption and flexibility in operation.

One technique for determining threshold bounds in FIGS. 2A-3 uses techniques described below that are adapted from PCT Patent Application No. PCT/US2017/019996, filed Feb. 28, 2017, titled "A Piezoelectric MEMS Device for Producing a Signal Indicative of Detection of an Acoustic Stimulus" Pub. No. WO 2017/151650.

Piezoelectric Micro Electro-Mechanical Systems (MEMS) devices have an inherent ability to be actuated by stimulus even in the absence of a bias voltage for the transducer due to the piezoelectric effect of the material used to realize the transducer, e.g., AlN, PZT, etc. This physical property enables piezoelectric MEMS devices to provide ultra-low power detection of a wide range of stimulus signals, and provide deeper integration of the detection electronics within an application-specific integrated circuit (ASIC) without requiring specialized electronics at the system level or add-on blocks that do not optimize the power performance of the transducer.

MEMS capacitive microphones require a charge pump to provide a polarization voltage to the back-plate. Charge pumps require a clock and storage capacitors to store charge that is pumped onto the back-plate. Multiple stages are required to boost the polarization voltage to required levels. When initially turned on, time is required to achieve desired levels based on clock frequency, storage capacitor size, and available supply voltage.

Piezoelectric MEMS devices do not require a charge pump. Furthermore, the charge generated by the piezoelectric effect is always being generated due to stimulus causing mechanical stress. As a result, ultra-low power circuits can be utilized to transfer this charge to a voltage and provide an output relative to the mechanical stress induced on the Piezoelectric MEMS device through simple gain circuits. Higher voltages are not required to achieve higher transducer sensitivity.

One particular application, utilizing Piezoelectric MEMS Microphones and taking advantage of this effect, is a circuit that will produce a signal based on a prescribed minimum acoustic input level indicating an acoustic stimulus was detected. This signal could be further utilized by the system and/or microphone to perform further actions, i.e., mode to a higher performance state, turn on other components within the system, begin a digital acquisition to further investigate the acoustic stimulus and identify its components.

Figure 5:
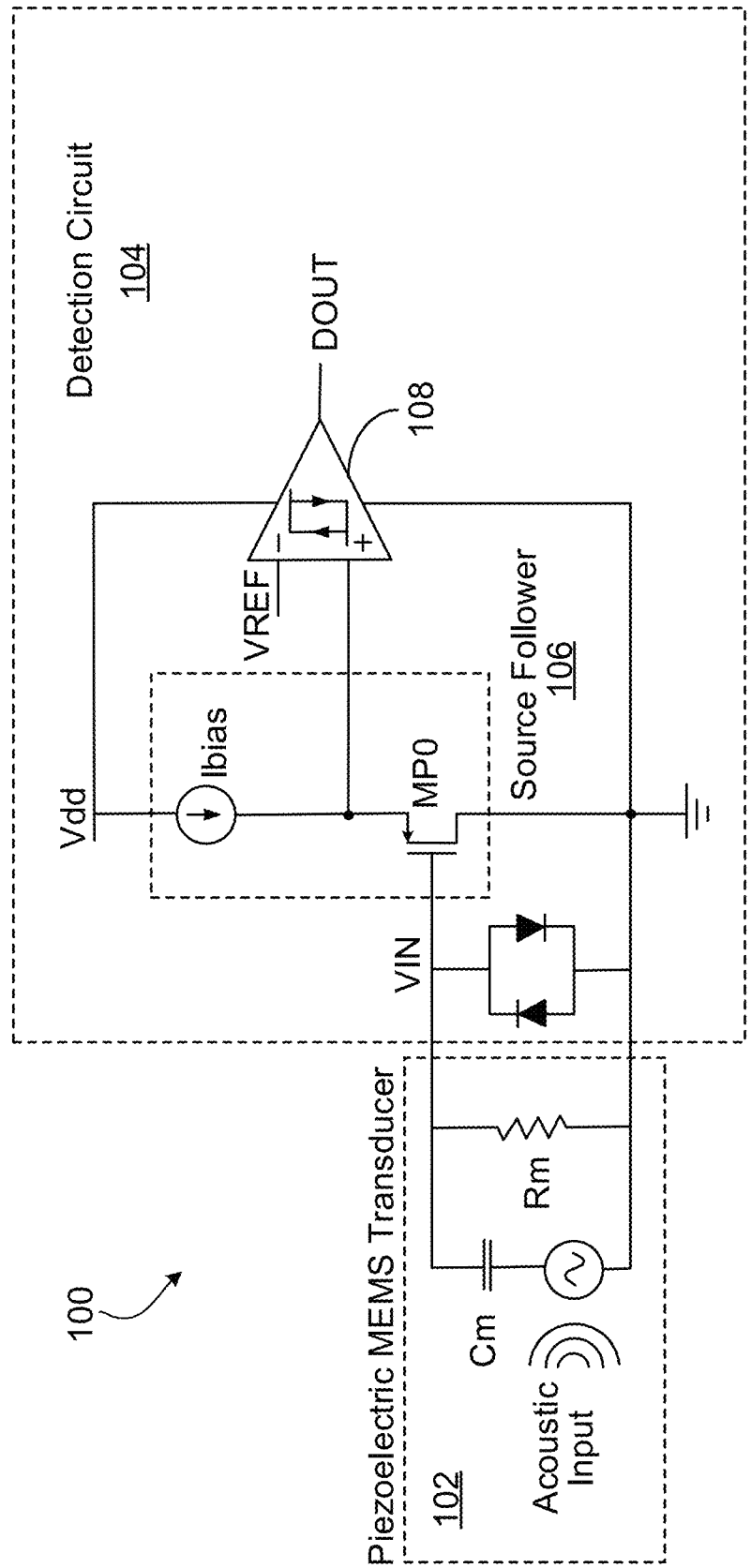
FIGS. 5, 5A-5C are block diagrams of a device including detection circuitry.

In an example, detection circuit of an acoustic device, such as a microphone, interfaces to a logic circuit that is part of the acoustic device (as shown in FIG. 2B), rather than the acoustic device including a detection pin that allows an application processor to perform the logic (as shown in FIGS. 2A and 5). The detection circuit is designed to indicate when an input pressure stimulus reached a prescribed level. The detection circuit triggers a digital state machine indicating that a signal was heard. The state machine modes the microphone ASIC to a higher performance state. Due to the inherent startup advantages of piezoelectric microphones, this state is achieved instantly. The digital state machine can also signal the system to exit from sleep mode, if the system were capable of a sleep mode, and be prepared to process the signal further. The microphone would contain the logic necessary to determine the ambient acoustic environment and make a decision on which action to take for further processing of the sensed acoustic environment.

In another example, the logic required on the microphone ASIC is simplified, pushing the decision making logic of the ambient acoustic environment to the application processor, as shown in FIGS. 2A and 5. The microphone ASIC then simply realizes a detection circuit, with a detection level set to an acoustic input level. The ASIC then latches an acoustic event that crossed this threshold, signaling the system, and allowing the system to mode the ASIC into a high performance state for detailed interrogation of the ambient acoustic environment. The ASIC would realize this functionality by having a dedicated input to control which mode it is in, and a dedicated digital output that signals the system when the microphone is in wake on sound mode and an acoustic stimulus has crossed the detection threshold. Generally, wake on sound includes a mode or a configuration of a device (such as a microphone, acoustic device, acoustic transducer, acoustic, piezoelectric transducer, piezoelectric device, MEMS microphone and so forth) in which the device adjusts or transitions among states, modes or actions in response to detection of satisfaction of a threshold input stimulus, e.g., an audio input at or above a threshold level. In another example, wake on sound includes a mode in which a device (e.g., including an acoustic transducer and/or an integrated circuit) is configured to detect an acoustic stimulus or detection of satisfaction of one or more criteria and is further configured to perform one or more actions or transition among modes or states upon the detection.

Referring to FIG. 5, circuit 100 includes transducer 102 and detector circuit 104. Source follower stage 106 transforms the charge generated by transducer 102 and provides gain for the next stage (e.g., a latched comparator stage). The second stage is a latched comparator 108, which compares the output of the source follower 106 to a reference voltage that is designed to target a specific minimum acoustic input sound pressure level (SPL). Once this level has been sensed, the latched comparator 108, latches the event, and provides a signal indicating such. The latch uses positive feedback to effectively act as a memory cell. Once power is removed from the latch, the information that was latched is cleared or lost, while memory, e.g., static random access memory (SRAM), retains the information even with the power removed. As described in further detail below, this provided signal is output to a detection pin that alerts an external system of detection of the SPL. This signal can be further used to control/trigger other events within the application specific integrated circuit (ASIC) or within the overall system by driving this signal off chip. In a variation, latched comparator 108 is configured to detect when the acoustic input (or VIN) satisfies one or more specified criteria. There are various types of criteria that the detection circuit can be configured to detect. These criteria include, e.g., voice criteria (detection of voice), keyword criteria (e.g., detection of keywords), ultrasonic criteria (e.g., detection of ultrasonic activity in proximity to our surrounding the transducer or acoustic device), criteria of detecting footsteps, mechanical vibrations/resonances, gunshots, breaking glass, and so forth.

In this example, a bandwidth of the preamplifier stage (e.g., implemented by the preamplifier) determines a spectrum of input signals that trigger the comparator stage implemented by latched comparator 108. Ultra-Low Power electronics typically have bandwidths still acceptable for the audio range. Also, impulse acoustic events trigger a broad spectrum increase in energy, acceptable for triggering with the comparator.

Further processing to discriminate specific frequency and frequency bands is implemented as well providing the ability detect specific acoustic signatures, i.e., command words, acoustic signals, at ultra low power (due to the external audio-subsystem being powered down, as described in further detail below). Multiple devices (configured for wake on sound mode) could also be implemented as an array. In this example, the DOUT/VOUT signals are processed providing the ability to perform directionality measurement, beam-forming, beam-steering, proximity detection, and Signal-to-Noise improvement.

Figure 5A:
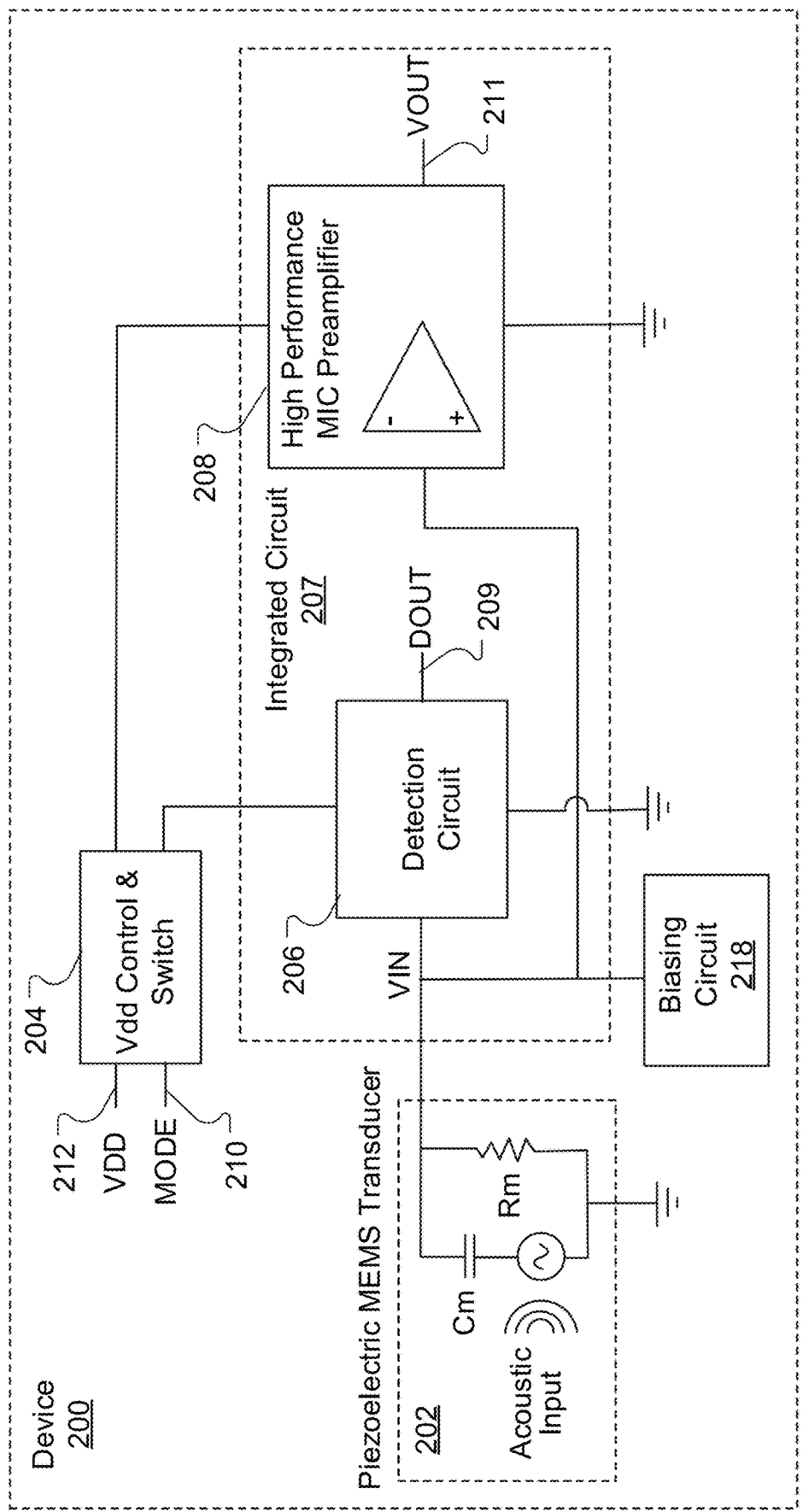

Referring to FIG. 5A, device 200 implements wake on sound in a configurable mode. In this example, device 200 includes an acoustic device. Device 200 includes switch 204, transducer 202, detection circuit 206 (e.g., detection circuit 14 in FIG. 2 or detection circuit 104 in FIG. 1), integrated circuit ("IC") 207 (hereinafter "IC" 207) and preamplifier 208. In a variation, IC 207 includes gain circuitry, an amplifier or another circuit, rather than preamplifier 208.

Figure 8A:
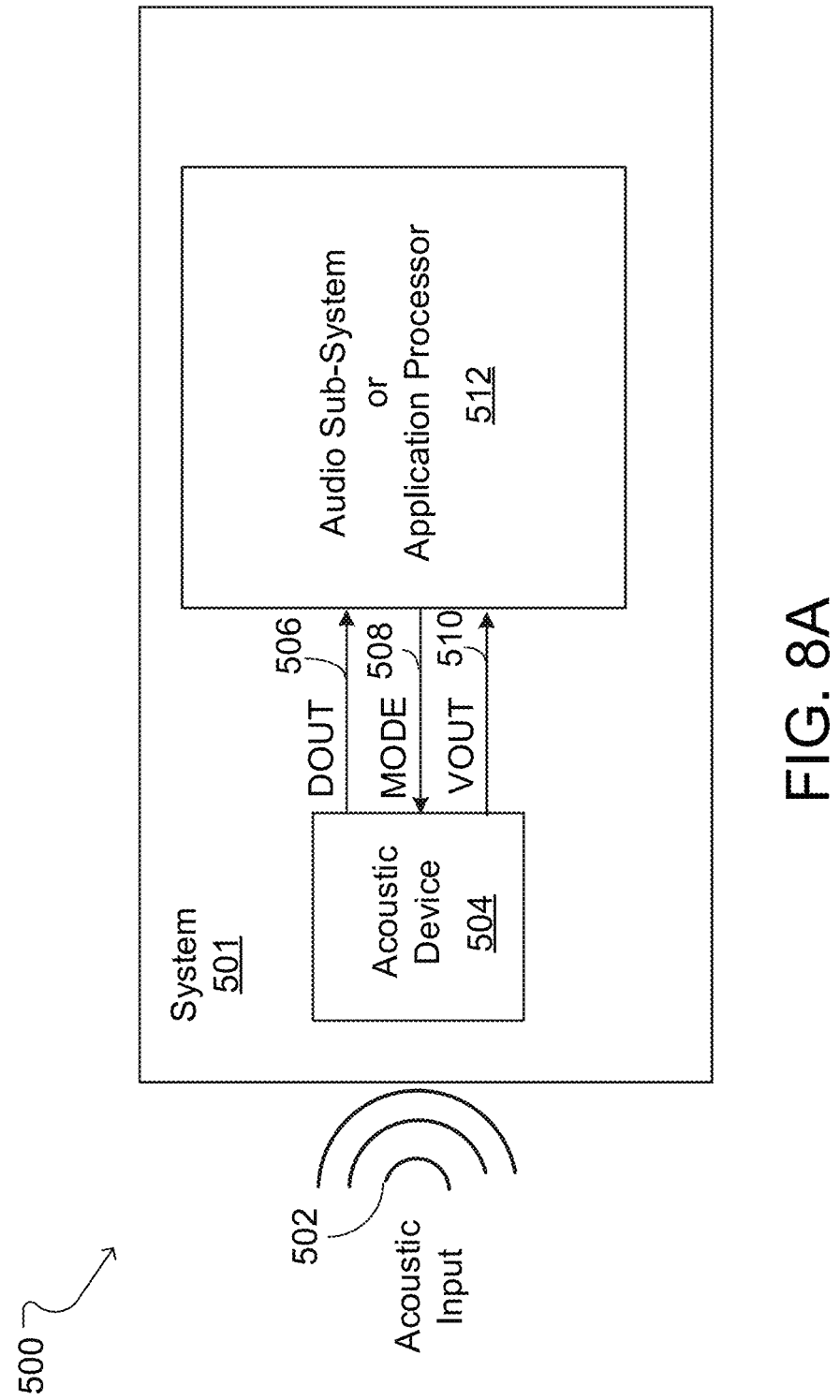
FIGS. 8A-8B and 9 are block diagrams showing detection circuitry in a system.

In this example, preamplifier 208 is configured to process audio input in an operational mode and is further configured to be powered on, following detection of one or more of the specified criteria. Switch 204 is configured to switch device 200 between a first mode (e.g., a wake on sound mode) and a second mode (e.g., a normal or operational mode), e.g., in response to receipt of an instruction from a processor external to device 200. Switch 204 includes pins 210, 212. Generally, a pin includes a pad (e.g., that is attached or mounted to a circuit). Pin 210 is a mode pin and is a dedicated input for controlling the mode of device 200. Pin 212 is a voltage drain (VDD) pin that inputs the VDD of device 200 into switch 204. In this example, an external system (e.g., such as processor 512 in FIG. 8A) controls the mode of operation of device 200 by transmitting a mode signal that sets (on mode pin 210) mode=1 (i.e., mode=VDD), which causes device 200 to transition to wake on sound mode in which detection circuit 206 is powered on, e.g., by routing VDD to detection circuit 206. In this example, pin 210 includes a pad configured to receive, from an external processor, a signal that causes device 200 to switch from a first mode (e.g., a wake on sound mode) to a second mode (e.g., an operational mode). In this example, the first mode includes a mode in which detection circuit 206 is substantially powered on and preamplifier 208 is substantially powered off (e.g., entirely powered of or a state in which a minimum amount of power is consumed). In this example, the second mode includes a mode in which preamplifier 208 is substantially powered on and detection circuit 206 is substantially powered off. In this example, device 200 is configured to switch from the first mode to the second mode, upon detection that the input audio satisfies one or more criteria.

When mode pin 210 is set to equal 0 (via the mode signal), device 200 operates in operational mode (e.g., a normal mode) in which detection circuit 206 is powered down (or substantially powered down) and preamplifier is powered on (or is substantially powered on) by routing VDD to preamplifier 208. That is, a voltage equal to VDD modes IC 207 into the wake on sound mode, while a floating or low signal modes IC 207 into normal operation. The mode signal is buffered, and further controls power switch 204 which routes VDD to either the high performance circuitry (e.g., preamplifier 208) or the wake on sound circuitry (e.g., detection circuitry 206). The mode signal also configures input biasing circuitry (e.g., biasing circuit 218) to control switches (included in the input biasing circuitry), which properly configure the input biasing network and switch for transducer 202.

In this example, transducer 202 receives acoustic input and transducer 202 converts that acoustic input into an input voltage (VIN). Detection circuit 206 detects when one or more criteria are satisfied by the acoustic input. In this example, detection circuit 206 is configured to operate substantially around 5 micro Amps. For example, detection circuit 206 detects when VIN equals a threshold voltage or a reference voltage (VREF), such e.g., VIN=VREF. Upon detection of satisfaction of one or more of the detection criteria, detection circuit 206 produces a signal that causes detect pin 209 to go "high" (e.g., have a value equal to one). There are various types of detection criteria. In an example, detection criterion comprises an adjustable threshold. The adjustable threshold is adjustable by software or one or more software updates and/or by one or more circuit configures and/or settings. In one example, the adjustable threshold comprises an adaptive threshold that is based on a specified or recorded noise level of a particular geographic area.

In this example, detect pin 209 includes a pad configured to transmit, to an external processor, a signal that specifies that the acoustic input stimulus to transducer 202 satisfies at least one of one or more detection criteria. There are various types of acoustic input stimulus, including, e.g., sound, pressure, and so forth. An external processor or system (e.g., processor 512 in FIG. 8A) receives this signal from detect pin 209. In response to this signal, the external processor powers on or powers up to an increased power level (relative to a power level before the processor received this signal), as described in further detail below. Additionally, in response to the signal, the processor sets the mode pin 210 to a low value to cause device 200 to transition from wake on sound mode to operational mode. In this example, device 200 is configured to receive a signal from a processor external to device 200, with the signal being for powering off detection circuit 206 and for powering on preamplifier 208. In another example, device 200 is configured to receive a signal from a processor external to the device, with the signal being for reducing a power level of detection circuit 206, relative to a power level of detection circuit 206 prior to detection, and with the signal further being for increasing a power level of preamplifier 208, relative to a power level of preamplifier 208 prior to detection.

In operational mode, another circuit in IC 207 (such as preamplifier 208) increases its power level of the second circuit, relative to a power level of the other circuit prior to detection. For example, in operational mode, preamplifier 208 is configured to operate in a range of 100-300 micro Amps. In this example, the signal generated by detection circuit 206 causes adjustment of performance of device 200 by causing an external processor to transmit an instruction to device 200 to increase a power level of a second circuit (e.g., preamplifier 208), relative to a power level of the second circuit prior to detection. In this example, preamplifier 208 is substantially powered off prior to detection. Once in operational mode, device 200 processes acoustic input 202 and outputs VOUT (e.g., pin 211) to an external processor or system for application processing. In this example, VOUT represents an output voltage that is based on voltage amplification of the acoustic input.

In a variation of FIG. 5A, device 200 is a packaged device for mounting on a substrate or another circuit. The packaged device includes a substrate for mounting the acoustic, piezoelectric transducer 202, detection circuit 208 and preamplifier 208 (or any other type of circuitry). The packaged device includes a housing portion for covering the substrate on which the transducer 202, detection circuit 208 and preamplifier 208 (or any other type of circuitry) are mounted.

Figure 5B:
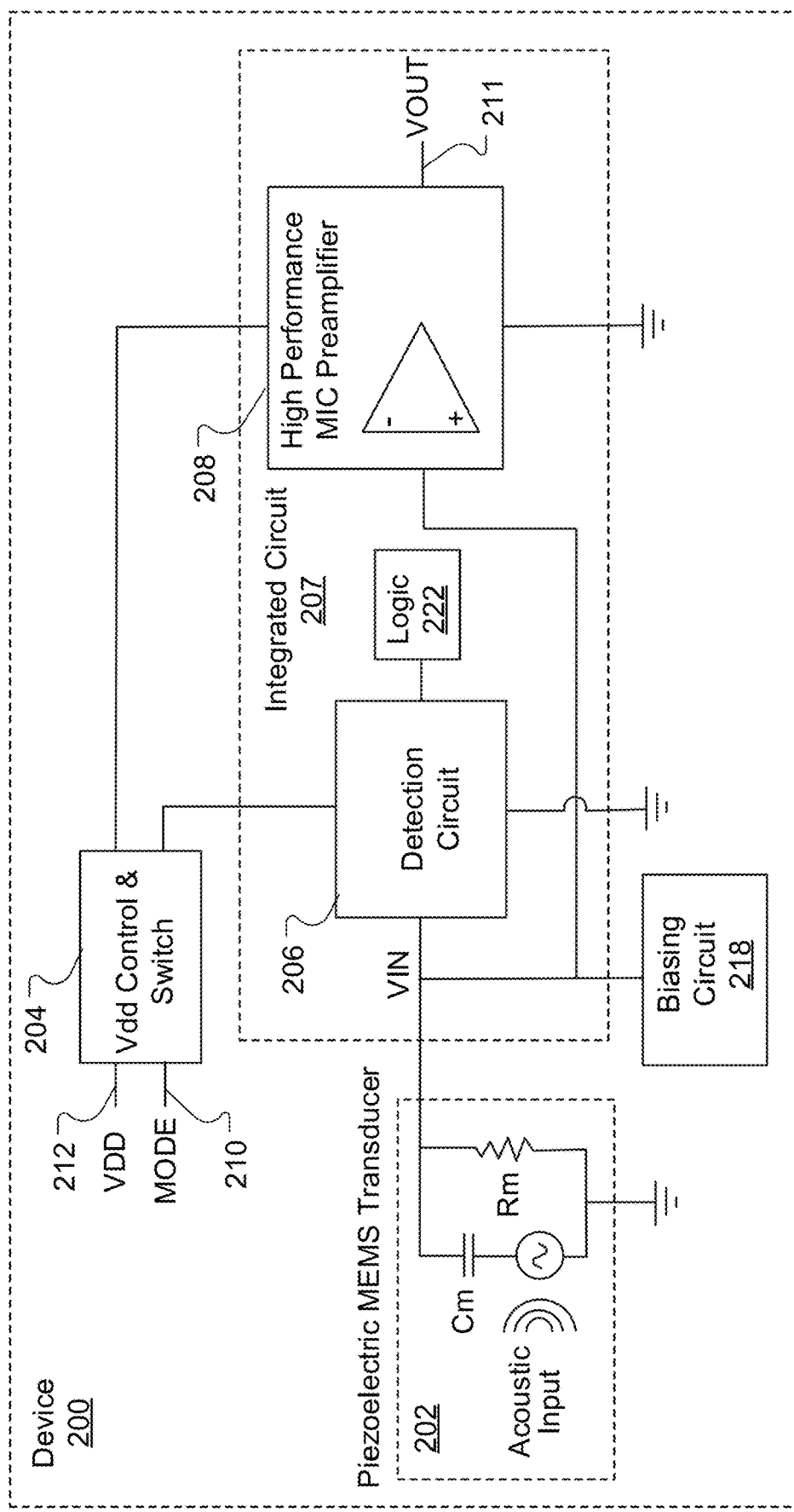

Referring to FIG. 5B, device 220 is a variation of device 200. Device 220 includes logic circuit 222 (hereinafter "logic 222"), e.g., rather than including detection pin 209. In this example, detection circuit 206 is configured to produce a signal, when the acoustic input satisfies one or more criteria (which are programmed into the detection circuit or which are accessible or readable by the detection circuit). In this example, logic 222 is configured to implement a digital state machine. Detection circuit 206 transmits to logic 222 the signal (that indicates the detection) to trigger digital state machine. The state machine (in logic 222) modes IC 207 to a higher performance state, e.g., by powering on preamplifier 208 and by powering off detection 206. That is, logic 222 is configured for reducing a power level of detection circuit 206, relative to a power level of detection circuit 206 prior to detection, and for increasing a power level of preamplifier 208, relative to a power level of preamplifier 208 prior to detection. Logic 222 includes configurable logic and/or software that is configurable to perform one or more specified operations.

Logic 222 instructs switch 204 to switch modes by transmitting a switching signal to switch 210 that causes mode pin 210 to go high or low. That is, switch 204 is configured to switch from a first mode (e.g., a wake on sound mode) to a second mode (e.g., an operation mode) in response to receipt of an instruction from logic 222 of device 220. The digital state machine also signals a system (e.g., external processor 512 in FIG. 8A) to exit from sleep mode, if the system were capable of a sleep mode, and be prepared to process the signal further. In this example, device 220 itself includes logic 222 for analyzing the ambient acoustic environment and making a decision on which action to take for further processing of the sensed acoustic environment (e.g., by deciding whether to operate in wake on sound mode or in operational mode).

In this example, detection circuit of an acoustic device, such as a microphone, interfaces to a logic circuit that is part of the acoustic device (as shown in FIG. 5B), rather than the acoustic device including a detection pin that allows an application processor to perform the logic (as shown in FIG. 5A). The detection circuit is designed to indicate when an input pressure stimulus reached a prescribed level. The detection circuit triggers a digital state machine indicating that a signal was heard. The state machine modes the microphone ASIC to a higher performance state. Due to the inherent startup advantages of piezoelectric microphones, this state is achieved instantly. The digital state machine can also signal the system to exit from sleep mode, if the system were capable of a sleep mode, and be prepared to process the signal further. The microphone would contain the logic necessary to determine the ambient acoustic environment and make a decision on which action to take for further processing of the sensed acoustic environment.

In another example, the logic required on the microphone ASIC is simplified, pushing the decision making logic of the ambient acoustic environment to the application processor, as shown in FIG. 5A. The microphone ASIC then simply realizes a detection circuit, with a detection level set to an acoustic input level. The ASIC then latches an acoustic event that crossed this threshold, signaling the system, and allowing the system to mode the ASIC into a high performance state for detailed interrogation of the ambient acoustic environment. The ASIC would realize this functionality by having a dedicated input to control which mode it is in, and a dedicated digital output that signals the system when the microphone is in wake on sound mode and an acoustic stimulus has crossed the detection threshold. Generally, wake on sound includes a mode or a configuration of a device (such as a microphone, acoustic device, acoustic transducer, acoustic, piezoelectric transducer, piezoelectric device, MEMS microphone and so forth) in which the device adjusts or transitions among states, modes or actions in response to detection of satisfaction of a threshold input stimulus, e.g., an audio input at or above a threshold level. In another example, wake on sound includes a mode in which a device (e.g., including an acoustic transducer and/or an integrated circuit) is configured to detect an acoustic stimulus or detection of satisfaction of one or more criteria and is further configured to perform one or more actions or transition among modes or states upon the detection.

Figure 5C:
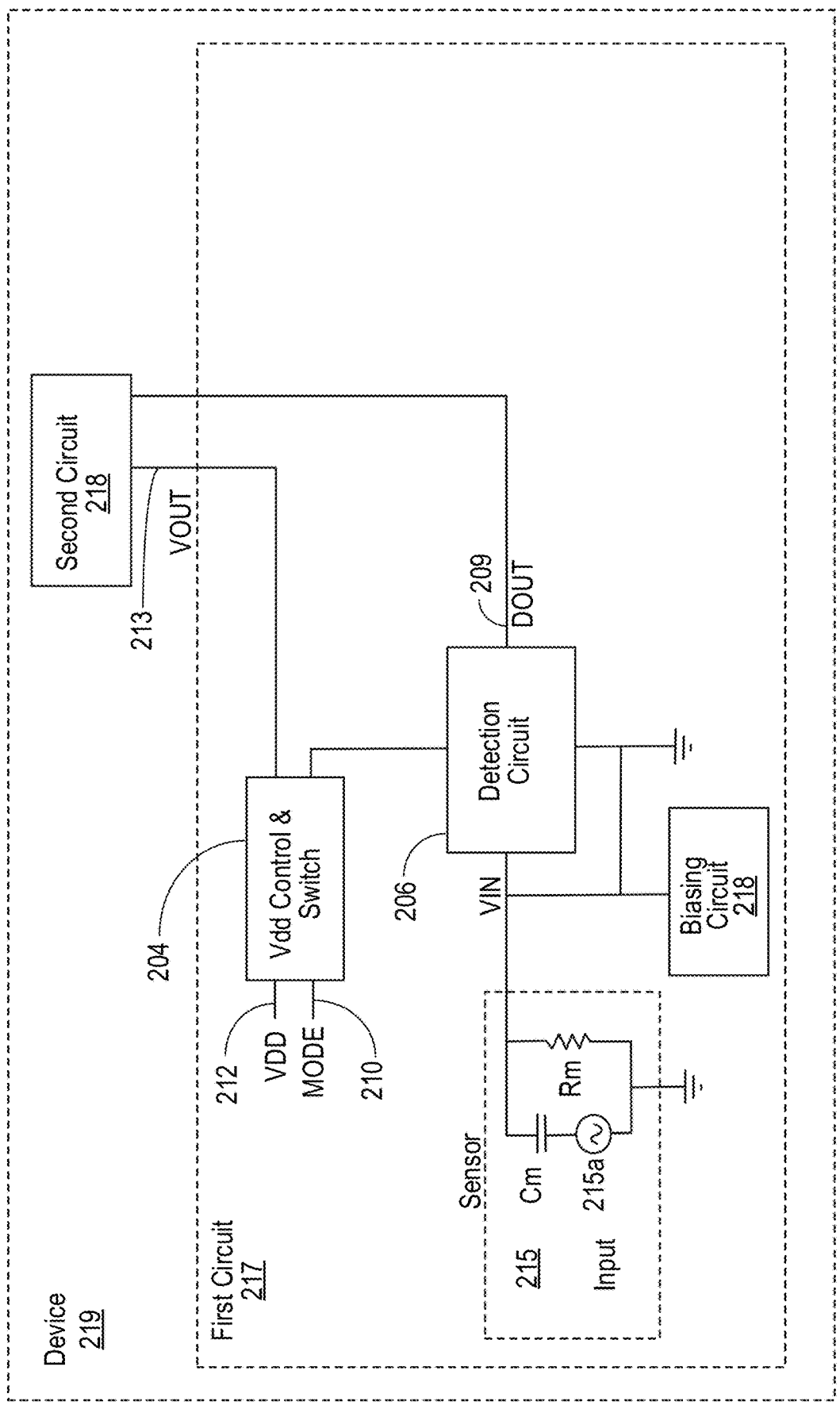

Referring to FIG. 5C, a variation of FIG. 5A is shown. In this variation, device 219 (e.g., a speaker, a smart speaker device, a smart speaker case, etc.) includes first circuit 217 and second circuit 218 (e.g., include one or more microphones (e.g., in a smart speaker case), a DSP chip, etc.). In this example, second circuit 218 includes circuitry that is turned on by first circuit 217. In this example, second circuit 218 includes a circuit that is in hibernation or that is powered down. In this example, when second circuit 218 is turned on, second circuit 218 transitions from a lower power state to a higher power state (relative to the power state of the lower power state). In this example, first circuit 217 is configured to mode or turn on all of second circuit 218 or one or more portions of second circuit 218. In this example, first circuit 217 includes sensor 215 for sensing, detecting or receiving sensed input 215a, e.g., detecting motion. Detection circuit 206, biasing circuit 218 and switch 204 each are configured to substantially operate as previously described with regard to FIG. 5A. In this example, the first circuit is configured to operate at substantially 8 microAmps. The second circuit is configured to operate using 20-350 microAmps.

For example, switch 204 is configured to switch first circuit 217 between a first mode (e.g., a wake on sensed input mode) and a second mode (e.g., a normal or operational mode). Generally, a wake on sensed input mode includes a mode or a configuration of a device in which the device adjusts or transitions among states, modes or actions in response to detection of satisfaction of a threshold input stimulus that is sensed by a sensor.

In this example, pin 210 is a mode pin and is a dedicated input for controlling the mode of first circuit 217. Pin 212 is a voltage drain (VDD) pin that inputs the VDD of first circuit 217 into switch 204. In this example, device 219 (or second circuit 218) controls the mode of operation of first circuit 217 by transmitting a mode signal that sets (on mode pin 210) mode=1 (i.e., mode=VDD), which causes first circuit 217 to transition to wake on sensed input mode in which detection circuit 206 is powered on, e.g., by routing VDD to detection circuit 206. In this example, pin 210 includes a pad configured to receive, from an external processor, a signal that causes first circuit 217 to switch from a first mode (e.g., a wake on sensed input mode) to a second mode (e.g., an operational mode). In this example, the first mode includes a mode in which detection circuit 206 is substantially powered on. In this example, the second mode includes a mode in which detection circuit 206 is substantially powered off. In this example, first circuit 217 is configured to switch from the first mode to the second mode, upon detection that the input satisfies one or more criteria.

When mode pin 210 is set to equal 0 (via the mode signal), first circuit 217 operates in operational mode (e.g., a normal mode) in which detection circuit 206 is powered down (or substantially powered down). That is, a voltage equal to VDD modes detection circuit 206 into the wake on sensed input mode, while a floating or low signal modes detection circuit 206 into normal operation. The mode signal also configures input biasing circuitry (e.g., biasing circuit 218) to control switches (included in the input biasing circuitry), which properly configure the input biasing network and switch for sensor 215.

In this example, sensor 215 receives input 215a and sensor 215 converts that input into an input voltage (VIN). Detection circuit 206 detects when one or more criteria are satisfied by the input. In this example, detection circuit 206 is configured to operate substantially around 5 micro Amps. For example, detection circuit 206 detects when VIN equals a threshold voltage or a reference voltage (VREF), such e.g., VIN=VREF. Upon detection of satisfaction of one or more of the detection criteria, detection circuit 206 produces a signal that causes detect pin 209 to go "high" (e.g., have a value equal to one). In this example, detect pin 209 includes a pad configured to transmit, to second circuit 218, a signal that specifies that the input 215a to sensor 215 satisfies at least one of one or more detection criteria. There are various types of input stimulus, including, e.g., pressure, movement and so forth. An external processor or system (e.g., second circuit 218) receives this signal from detect pin 209. In response to this signal, the external processor powers on or powers up to an increased power level (relative to a power level before the processor received this signal) or performs one or more specified actions (e.g., turning on a light). Additionally, in response to the signal, device 219 (or second circuit 218 or even another circuit within device 219) sets the mode pin 210 to a low value to cause first circuit 217 to transition from wake on sensed input mode to operational mode. In this example, first circuit 217 is configured to receive a signal from a processor external to first circuit 217, with the signal being for powering off detection circuit 206. In another example, first circuit 217 is configured to receive a signal from a processor (e.g., device 219) external to first circuit 217, with the signal being for reducing a power level of detection circuit 206, relative to a power level of detection circuit 206 prior to detection.

Once in operational mode, first circuit 217 processes input 215a and outputs VOUT (e.g., pin 213) to second circuit 218 in device 219 for application processing. In an example, second circuit 218 includes an external processor or subsystem. In this example, VOUT represents an output voltage that is based on processing of input 215a. In a variation, pin 213 is optional (e.g., making VOUT optional).

Figure 6A:
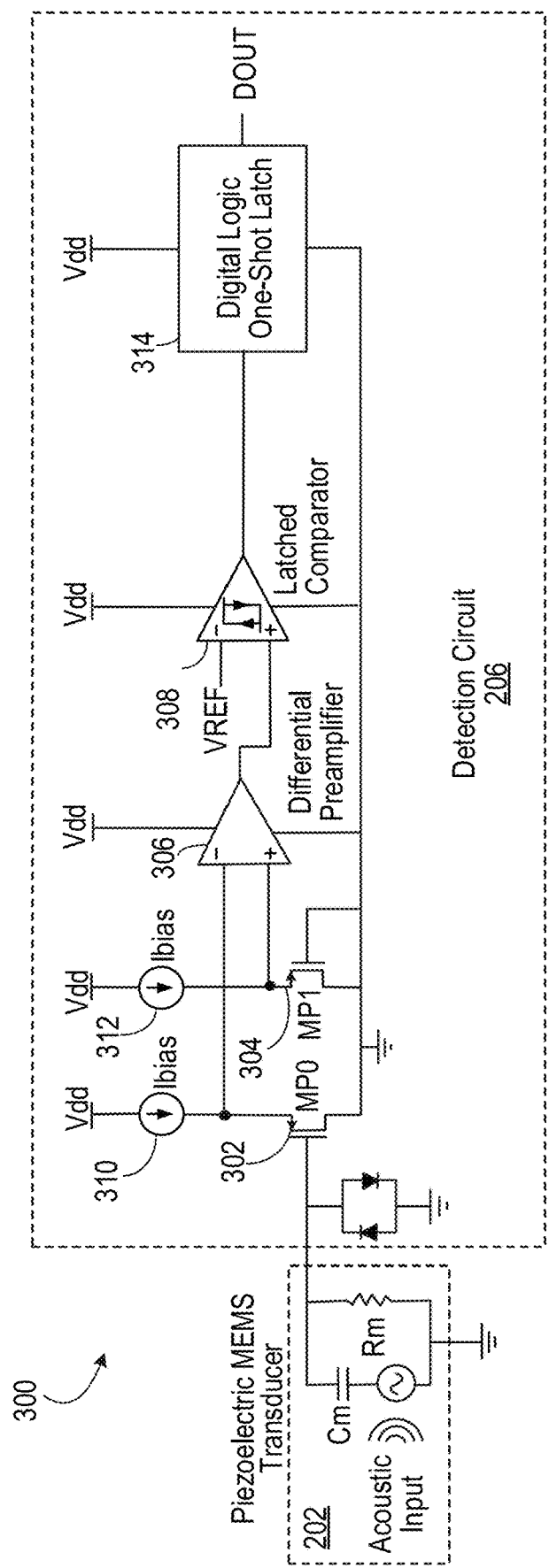
FIGS. 6A-6B are block diagrams of detection circuitry.

Referring to FIG. 6A, architecture diagram 300 shows transducer and detection circuit 206. For wake on sound mode, transducer 202, as well as switch 204 (FIG. 5A) is biased (via biasing elements 310, 312) to a source voltage (VSS) of a circuit on which device 200 is connected. Two PMOS source follower circuits 302, 304 are used to buffer the signal received from transducer 202, as well as a VSS reference, to the input of a differential preamplifier 306. The differential preamplifier 306 is biased to provide approximately 60 dBV of gain to the signal from transducer 202. The startup switch timing is configured, by extending the reset time of the switch while in wake on sound mode, to stabilize the DC level of the source followers feeding the input to the differential preamplifier.

The output of the preamplifier 306 is routed to the input of a latched comparator 308 that is configured to determine whether the acoustic input satisfies one or more detection criteria. The reference side of the comparator is set to a voltage level scaled proportionately to the minimal acoustic detection threshold.

Once triggered (e.g., by detecting that the acoustic input satisfies one or more detection criteria), the latched comparator 308 latches the output to a high voltage level. This signal is further processed with a D-Latch circuit 314, which acts as a one-shot latch. The ASIC (e.g., IC 207) needs to be commanded, through the mode signal, out of the Wake on Sound mode to clear this signal. The latched signal, DOUT, is output from the ASIC for processing by the system.

Figure 6B:
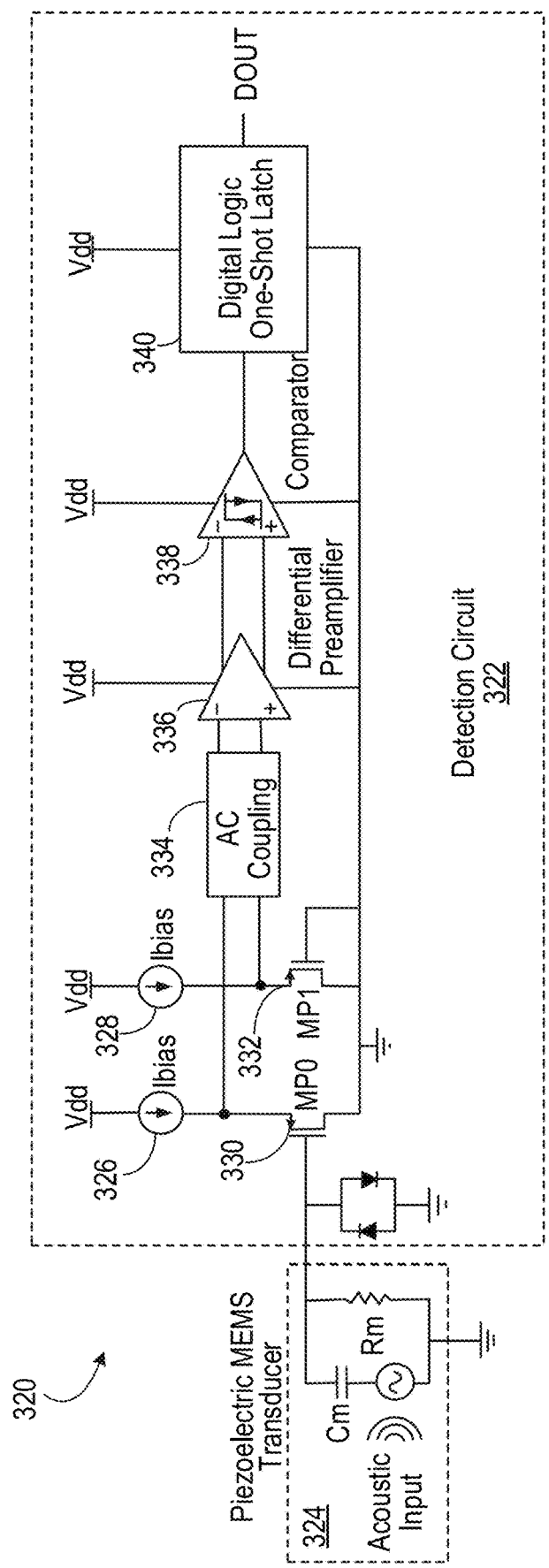

Referring to FIG. 6B, architecture diagram 320 shows transducer 324 and detection circuit 322. In an example, detection circuit 322 is a same detection circuit as detection circuit 206 in FIG. 5A. For wake on sound mode, transducer 324, as well as switch 204 (FIG. 5A), is biased (via biasing elements 326, 328 to a source voltage (VSS) of a circuit on which device 200 is connected. Two PMOS source follower circuits 330, 332 are used to buffer the signal received from transducer 324, as well as a VSS reference, to the input of an AC Coupling Circuit 334, allowing the signals to be re-biased to a preferred common mode voltage, increasing (e.g., maximizing) dynamic range of the differential preamplifier 336. The differential preamplifier 336 is biased to provide approximately 60 dBV of gain to the signal from transducer 324.

The output of the preamplifier 336 is routed to the input of a differential comparator 338 that is configured to determine whether the acoustic input satisfies one or more detection criteria. The comparator 338 is designed with hysteresis, and this hysteresis level, in coordination with the gain of the differential preamplifier 336 determines the detection criteria.

Once triggered (e.g., by detecting that the acoustic input satisfies one or more detection criteria), the comparator 338 latches the output to a high voltage level. This signal is further processed with a D-Latch circuit 340, which acts as a one-shot latch. The ASIC (e.g., IC 207 in FIG. 5A) needs to be commanded, through the mode signal, out of the wake on sound mode to clear this signal. The latched signal, DOUT, is output from the ASIC for processing by a system.

This voltage level is set by the scale factor of the MEMS as well as the attenuation of the source follower and the gain of the differential preamplifier.

The following equation equates a reference voltage (VREF), a scale factor (SF) of the transducer, an attenuation (Atten) of the source follower, and a gain of the preamplifier (AV), to a specified (e.g., minimum) detectable acoustic threshold ($P_a$):

$$Pa_{Min.Threshold} = \frac{VREF}{SF * Atten * AV}$$

There is a tradeoff between each of the gain elements and the minimum detectable acoustic threshold. Increasing the gain of the preamplifier or scale factor of the MEMS, will provide the ability to detect very quiet signals, however this needs to be balanced with the headroom available due to VDD. If louder acoustic signals are desired to trigger the detection circuit, then gain needs to be removed from the circuit, or VREF increased.

Referring to FIG. 7A, diagram 400 illustrates results of operation of a device configured for wake of sound. Representation 402 represents a signal (e.g., a noisy, ambient acoustic signal) that has been processed by the transducer and preamplifier. At time 5 ms, a 1 kHz acoustic stimulus is sensed by the transducer, resulting in the waveform shown. In this example, representation 402 represents an acoustic stimulus. This acoustic stimulus, processed by the transducer and preamplifier, crosses the reference voltage line 404 a little after 5 ms.

Referring to FIG. 7B, diagram 452 illustrates representation 452 of digital output signal over time. In this example, digital output is the digital output of a detection circuit that is processing the signal represented by representation 402. As shown by diagram 452, the digital output transitions from low to high, and remains high, e.g., once the signal represented by representation 402 exceeds the reference voltage. The system (e.g., external processor 512 in FIG. 5A) is required to process this transition, and clear the signal by commanding the device from wake on sound mode, to normal operation mode. The system (e.g., external processor 512 in FIG. 5A) can then determine whether or not to put the microphone back into wake on sound mode depending on the resulting measurements taken of the ambient acoustic environment while in normal operation. For example, the system can monitor the acoustic signal (e.g., a voltage of the acoustic signal) and determine if the acoustic threshold in wake on sound mode would be exceeded. If the system does not measure an acoustic signal exceeding the threshold (e.g., an acoustic signal with a voltage exceeding a threshold voltage) for some period of time, such as 5 minutes, then the system can put the microphone back into wake on sound mode.

In another example, the system can put the microphone back into WOS mode very soon after the threshold is exceeded and use other microphone(s) to monitor the acoustic environment. The system can continuously reset the WOS microphone back to WOS mode and wait until it goes for some period of time, such as 5 minutes, without the threshold being exceeded. If the threshold is not exceeded for some period of time, the system can turn off the remaining microphones and enter the lower-power state.

Figure 9:
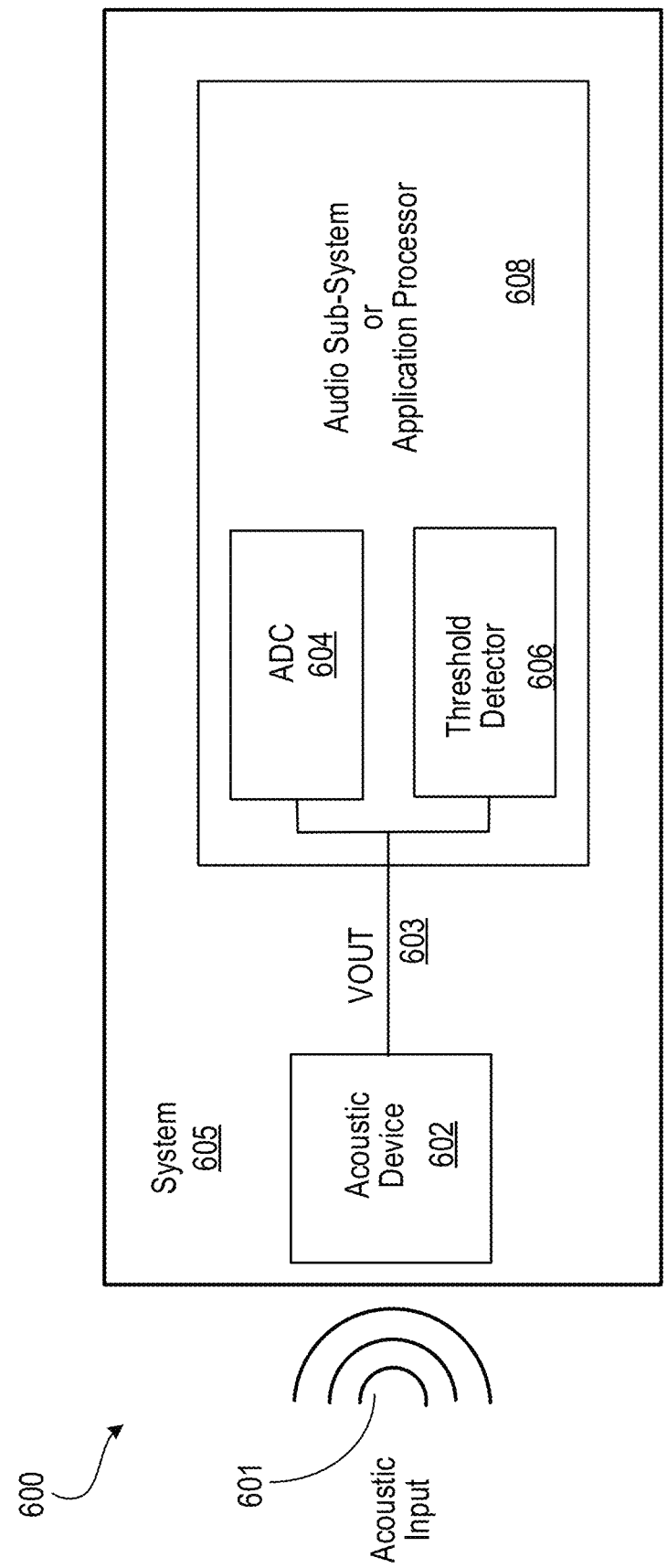

In an example, an acoustic threshold detection circuit occurs after the microphone in a system, e.g., as shown in FIG. 9. The circuit block would use the microphone output as its input where it could then detect low-level signals, and provide command and control outputs to the audio subsystem or application processor.

In another example, rather than placing the detection circuit after the microphone, detection is performed immediately after the transducer (e.g., by placing the detection circuit immediately after the transducer), providing for finer system command and control. For example, when a microphone or acoustic device is commanded into the wake on sound mode, it consumes only 5 uA of current, a 30× reduction in current consumption in normal mode operation, (150 uA) and provides a means of signaling the system to acoustic detection events, and has the capability of having its mode controlled by that system. As such, the entire audio subsystem could be powered down, saving considerable power when compared to other detection system architectures which would require some of the audio sub-system or application processor remain operational.

Based on the wake on sound architecture, the overall power consumption of the system is reduced, while providing for an acoustic stimulus to control overall system state, either sleep mode or active mode, with nearly zero power consumption. This circuitry, when realized directly off the transducer, increases the overall sensitivity of the microphone by nearly 60 dBV. Normal Operation, and the industry standard, specifies the sensitivity of the microphone at −38 dBV. In an example of a 1 Pa-RMS acoustic stimulus, the voltage output of the preamplifier would be approximately 12.5 mV-RMS. With the wake on sound mode enabled, the sensitivity of the microphone is increased to nearly +20 dBV (i.e., for a 1 Pa-RMS acoustic stimulus, the voltage output of the preamplifier would be approximately 10V-RMS) The voltage headroom will ultimately limit the maximum acoustic stimulus that can be sensed before saturating the electronics, but an assumption of operation is that the overall acoustic environment is quiet and filled with low-level signals.

Referring to FIG. 5A, system architecture 500 is shown. In this example, system 501 includes acoustic device 504 and processor 512, which is external to acoustic device 504. In an example, acoustic device 504 includes device 200 (FIG. 5A) with an acoustic transducer, a detection circuit and a preamplifier. Acoustic device 504 receives acoustic input 502. In this example, acoustic device 504 includes detect pin 506 (e.g., which may be the same as detect pin 209), mode pin 508 (e.g., which may be the same as mode pin 210) and output voltage (VOUT) pin 510 (e.g., which may be the same as VOUT pin 211). Detect pin 506 is configured to indicate when acoustic input 502 equals or exceeds a threshold voltage (e.g., VREF). Mode pin 508 is configured to instruct acoustic device 504 to enter or to exit wake on sound mode. VOUT pin 510 specifies an output voltage (based on an acoustic input) from the acoustic transducer 504, for processing of the acoustic or audio input by processor 512. At a time prior to receipt of acoustic input, acoustic device 504 is powered on and processor 512 is powered off or in a "watchdog" or polling state in which processor 512 intermittently polls detect pin 506 for signals. Additionally, at this time, mode pin 508 is configured to wake on sound mode. Upon receipt of acoustic input 502 that is greater than or equal to the threshold voltage, detect pin 506 goes high (e.g., based on an output of a detection circuit in acoustic device 504). The logic of processor 512 in the watchdog state detects that detect pin 506 has gone high. In response, processor 512 powers on (e.g., processor 512 powers up) and sets mode pin 508 to be normal mode, thus causing acoustic device to transition out of wake on sound mode. By setting mode pin 508 to normal mode, device 504 is instructed (by processor 512) to power up the preamplifier (e.g., preamplifier 208 in FIG. 2) to enable acoustic device 504 to operate in "normal mode" and to power down the detection circuit (e.g., detection circuit 206) of acoustic device.

Figure 8B:
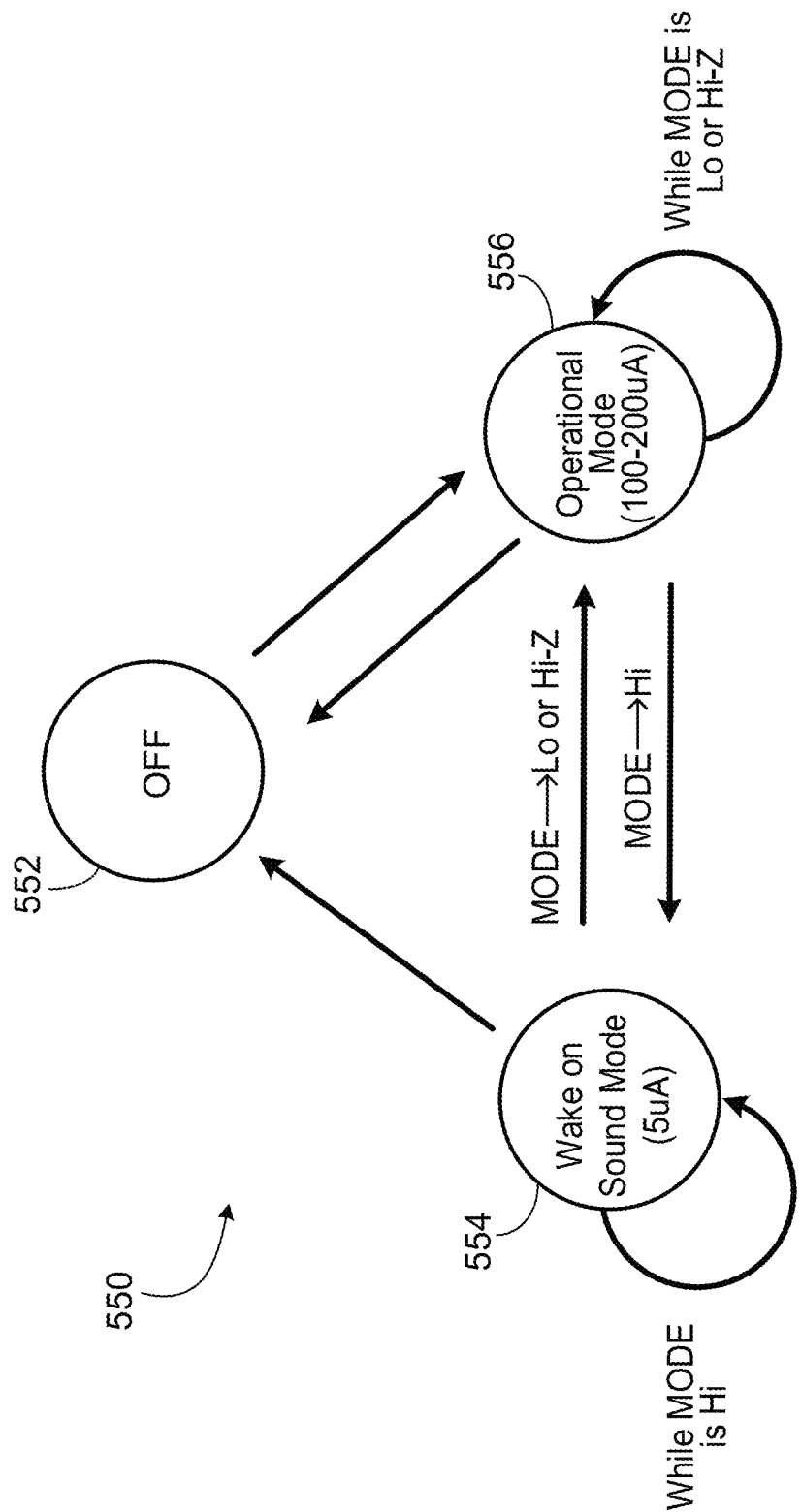

Referring to FIG. 8B, moding diagram 550 illustrates the modes of a chip and how the chip enters those modes. Node 552 represents a state in which the chip is off. Node 556 represents a state in which the chips operates in operational mode. In this example, the chip enters the operational mode when VDD has a voltage in a specified range (e.g., when VDD=1.6V-3.6V). The chip remains in operational mode while the mode is low or high impedance ("Hi-Z"), indicating that a signal that is "floating" or being driven by electronics that are powered "off." The chip transitions from operational mode to wake on sound mode (represented by node 554), when the mode goes high. The chip turns off when VDD has a low voltage or VDD=0V.

Referring to FIG. 9, another system architecture 600 is shown. In this example, system 605 includes acoustic transducer 602 and processor 608. Processor 608 includes analog-to-digital converter (ADC) 604 and threshold detector 606. In this example, threshold detector 606 is configured to detect when acoustic input 601 equals or exceeds a threshold level, e.g., by detecting when a voltage generated by the acoustic input equals or exceeds a threshold voltage. For example, threshold detector 606 is a detection circuit, e.g., such as detection circuit 206 (FIG. 5A). However, in this example, the detection circuit 606 is part of processor 608, rather than being included in acoustic device 602. Because detection circuit 606 is part of processor 608, rather than being included in acoustic device 602, processor 608 needs to remain powered on to detect the audio stimulus.

In this example, ADC 604 and threshold detector 606 need to remain on, from a time before acoustic input 601 is received. This is because acoustic device 602 does not include a detect pin (e.g., such as pin 506) to detect the audio stimulus and transmit to processor 608 a signal indicative of the detection. (Referring back to FIG. 5A, acoustic device 504 is able to perform this detection, rather than an external processor, because of the piezoelectric material in the transducer that produces a voltage without requiring a voltage source). In this example, the detection is performed by processor 608, e.g., by using ADC 604 to convert VOUT 603 (which is based on acoustic input) to digital data that can be processed by threshold detector 606. Because the detection is performed by processor 608, logic (i.e., ADC 604) and threshold detector 606 need to remain on to detect an acoustic stimulus. As a result, processor 608 cannot be powered down or residing in a polling state (as processor 512 in FIG. 5A can be). Additionally, because acoustic device 602 does not include a mode pin, acoustic device 602 cannot be configured to switch between a mode in which a detection device is powered on or another mode in which a preamplifier is powered on. Rather, in acoustic device 602, a preamplifier must remain on, and cannot be powered on an off via mode switching.

Figure 10:
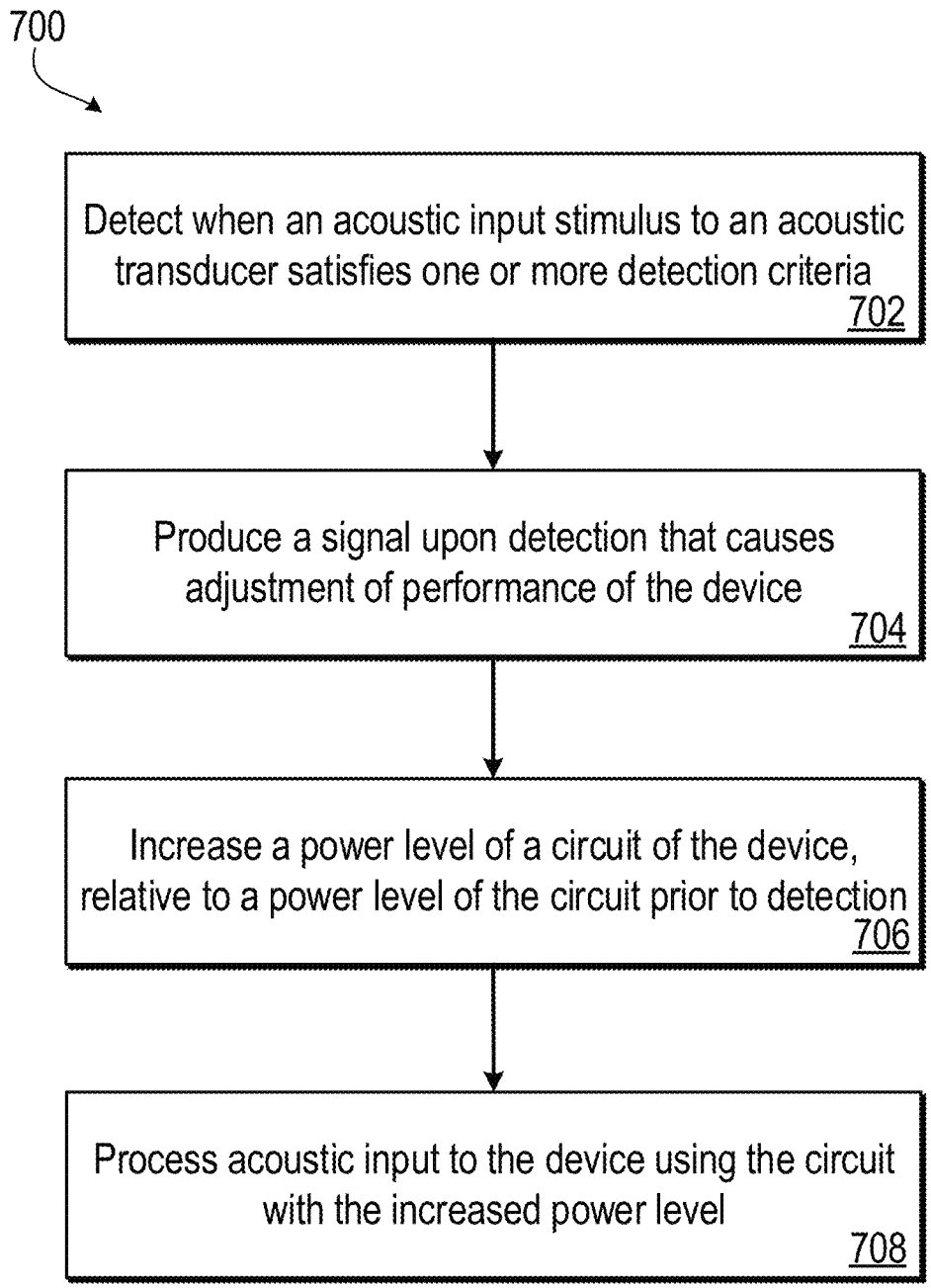
FIG. 10 is a flow diagram.

Referring to FIG. 10, process 700 is implemented by a device (e.g., device 200 in FIG. 2) in implementing one or more of the techniques described herein. In operation, device 200 (and/or detection circuit 206 in device 200) detects (702) when an acoustic input stimulus to acoustic transducer 202 of device 200 satisfies one or more detection criteria (e.g., that are retrieved by device 200 and/or that are programmed into device 200). Detection circuit 206 produces (704) a signal upon detection that causes adjustment of performance of device 200 by causing (706) a circuit (e.g., preamplifier 208) of device 200 to increase power level, relative to a power level of the circuit prior to detection. As described herein, the produced signal causes preamplifier 208 to increase its power level by causing an external system to detect the signal and in response to instruct device 200 to mode into operational mode. In another example, the produced signal causes preamplifier 208 to increase its power level by causing logic within device 200 to receive and/or to detect the signal and in response to instruct device 200 to mode into operational mode. Device 200 processes (708) acoustic input to device 200 using the circuit with the increased power level.

In an example, a device (as described herein) operates at a low power mode at the transducer level (when the device includes a transducer) and at the sensor level (when the device includes a sensor). For example, a low power mode includes consumption of less than 10 microAmps. In an example, a device includes an acoustic transducer; and a first circuit configured to detect when an acoustic level banded over (e.g., limited to) a frequency range exceeds a threshold level or when an average acoustic level for a plurality of acoustic levels that are each banded over the frequency range for a period of time exceeds the threshold level and is further configured to produce a first signal, e.g., when the acoustic level or the average acoustic level exceeds the threshold. In this example, the acoustic transducer has a flat response in a voice frequency range in which the acoustic transducer is substantially equally sensitive to frequencies in the voice frequency range. In some examples, the threshold level is between 60 dB SPL and 90 dB SPL at a frequency in the banded frequency range. In other examples, the threshold level is between 40 dB SPL and 110 dB SPL at a frequency in the banded frequency range. In this example, the frequency range comprises 300 Hz-5 kHz. That is, the first circuit is configured to only process those signals and levels with the specified range, which in this example is 300 Hz-5 kHz, but there could be other specified ranges. For those signals within the 300 Hz-5 kHz, the first circuit is further configured to detect which one of those signals exceeds a specified threshold (e.g., predefined threshold). In this example, the first circuit is in a power mode that consumes less than 350 microwatts. In another example, the first circuit is in a power mode that consumes approximately 20 microwatts, that consumes a range of approximately 20-350 microwatts and so forth. In still other variations, the power mode that consumes less than 350 microwatts is a power mode of less than 200 microwatts. The power mode that consumes less than 350 microwatts is a power mode of less than 100 microwatts. The power mode that consumes less than 350 microwatts is a power mode of less than 50 microwatts.

In some examples, the device further includes a second circuit configured to generate a second signal at least partly based on the first signal of the first circuit. In this example, the banded acoustic level comprises a limit at the acoustic level. The banded acoustic level is banded by the first circuit or banded at the first circuit in which the banding is done inside the first circuit. In this example, the first circuit banded over the frequency range comprises the acoustic transducer banded by mechanics of the acoustic transducer in which the acoustic transducer mechanically has a resonant frequency of the acoustic transducer such that the acoustic transducer does not sense frequencies outside the frequency range because such outside sensing is beyond mechanics of the acoustic transducer. In this example, the holes in a diaphragm (of the acoustic transducer) itself are banded at the low frequency. In this example, a high frequency does not have time to equalize. As such, a user would hear the high frequency sounds, but not the low frequency sounds. That is, the first circuit is banded mechanically by the resonance of the device. In still another example, the first circuit is banded electrically, rather than being banded mechanically. In electrical banded, the first circuit is limited in the high frequency side. Mechanics include mechanical or hardware capabilities. Banded by the first circuit includes the first circuit being configured to only detect a certain acoustic range. The device comprises a packaged device with an acoustic filter before an input port of the packaged device or of the acoustic transducer to acoustically band the first circuit.

In another example, the first circuit is configured to compute an average acoustic level, e.g., from a plurality of acoustic levels that each occur within a specified amount of time or period of time. In this example, the acoustic levels that are included in the average calculation are only those acoustic levels that occur within the specified frequency range, e.g., within 300 Hz-5 kHz. From that calculated average, the first circuit is configured to determine when the calculated average exceeds a threshold. In a variation of each of the foregoing examples (and more generally examples described herein), the device includes a sensor and the techniques described herein are performed with regard to a sensor.

The device also includes a second circuit configured to generate a second signal, at least partly based on the first signal of the first circuit. In this example, the second circuit is further configured to transmit the second signal to a digital system to cause the digital system to power on and to perform digital signal processing (DSP). In yet another example, the second circuit is configured to transmit the second signal to another system to cause that other system to perform one or more actions responsive to the second signal.

In an example, the device is a microphone and is included within another device (e.g., a smart speaker device—a device that turns on when a user speaks to it). In this example, when no user is speaking to the smart speaker device, only the microphone is turned on, which consumes less than 10 microAmps. Because the microphone is an analog device, the entire smart speaker device operates as an analog device, e.g., when it is listening for sound/acoustic level. In this mode, the first circuit is configured to detect only acoustic levels (e.g. rather than specific words or key words) that exceed a specified threshold and that occur within a specified range. Because the first circuit consumes less than 200 microwatts in this detection state, the smart speaker device can operate at very low power. The first circuit operates at such a low power state, because it is only detecting and evaluating frequencies or acoustic levels, not words or other forms of speech. In this low power state, the smart speaker system doesn't need to have its digital or digital signal processing (DSP) systems or components running. Rather, the smart speaker system can operate entirely in an analog mode. Then, once the first circuit detects that an acoustic level (or average acoustic level) exceeds the threshold, the first circuit generates a signal that causes the smart speaker device to power on its digital system and to perform keyword detection, e.g., to detect if the spoken word matches a keyword to "wake-up" the smart speaker system. In some examples, a detection criteria (that the first circuit implements for detection) specifies that an input pressure stimulus to the sensor reaches a threshold input level a certain number of times. In this example, the threshold input level is a threshold acoustic input level. In other examples, the first circuit is configured to detect when the acoustic level of the acoustic transducer exceeds the threshold level a certain number of times. In still other examples, the first circuit is configured to detect when the signal level of the sensor exceeds the threshold level a certain number of times.

In particular, upon successful detection, the first circuit generates a first signal and transmits that first signal to a second circuit. The second circuit then generates a second signal (based on the first signal) and transmits that second signal to another system (that performs DSP) within the smart speaker device. In this example, the first signal specifies if the received audio input (or other input, such as a pressure input) has exceeded a threshold or not. The second signal is doing something with that information (that specifies whether the threshold is exceeded), e.g., by including an instruction to perform some action—such as, e.g., turning on a light. In an example, the second circuit simply re-transmits the first signal, e.g., rather than generating a second signal. In this example, the acoustic transducer comprises a piezoelectric acoustic transducer or a capacitive acoustic transducer. The first circuit comprises an analog circuit, the second circuit comprises an analog circuit or the first and second circuits each comprise an analog circuit. The device itself comprises an analog device and/or is a packaged device.

In another example, the device (which includes the first and second circuits) is attached to or is in proximity to a physical device (e.g., such as a desk). In this example, the device detects movement at the desk (e.g., when the device includes a sensor, such as, an accelerometer, a chemical sensor, an ultrasonic sensor, an acoustic, piezoelectric transducer, a piezoelectric sensor, an acoustic transducer, an acoustic sensor, or a gyroscope). In this example, the device detects movement via a first circuit (included in the device) configured to detect when an energy level (e.g., rather than a frequency level) banded over a frequency range exceeds a threshold level or when an average energy level for a plurality of energy levels that are each banded over the frequency range for a period of time exceeds the threshold level and is further configured to produce a first signal. In this example, the average energy levels are computed by the first circuit using the same techniques described above with regard to computing an average acoustic level. The device also includes a second circuit for generating a second signal at least partly based on the first signal of the first circuit. In this example, when then first circuit detects that the energy level (or the average energy level) exceeds a specified threshold, the first circuit transmits a signal to the second circuit, which in turn transmits another signal (e.g., based on or the same as the signal received from the first circuit) to another device or electronic system, e.g., a device for turning on the lights. In this example, the lights are turned on when the device (that includes the first circuit and the second circuit) detects movement at the desk and/or in proximity to the desk. The device in this example includes and/or performs the above-described functionality and features.

Implementations of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Implementations of the subject matter described in this specification can be implemented as one or more computer programs, i.e., one or more modules of computer program instructions encoded on a tangible program carrier for execution by, or to control the operation of, a processing device. Alternatively or in addition, the program instructions can be encoded on a propagated signal that is an artificially generated signal, e.g., a machine-generated electrical, optical, or electromagnetic signal that is generated to encode data for transmission to suitable receiver apparatus for execution by a processing device. A machine-readable medium can be a machine-readable storage device, a machine-readable hardware storage device, a machine-readable storage substrate, a random or serial access memory device, or a combination of one or more of them.

The term "processing device" encompasses all kinds of apparatus, devices, and machines for processing data, including by way of example a programmable processor, a computer, or multiple processors or computers. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, an data base management system, an operating system, or a combination of one or more of them.

A computer program (which may also be referred to as a program, software, a software application, a script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

While this specification contains many specific implementation details, these should not be construed as limitations on the scope of any of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. A device comprising:
a sensor; and
a circuit configured to detect when an input stimulus to the sensor satisfies an adaptive threshold, and further configured to produce a signal upon detection to cause adjustment to operation of the device,
wherein the circuit is further configured to adjust the adaptive threshold in accordance with detected changes to sound over a specified amount of time in an environment in which the device is located; and
wherein the device is further configured to output data representing one or more sound levels prior to detection of the input stimulus that satisfies the adaptive threshold.

2. The device of claim 1, wherein the circuit is a first circuit and
wherein the device further includes:
a second circuit for processing input following detection, wherein the second circuit is configured to increase its power level following detection, relative to a power level of the second circuit prior to detection.

3. The device of claim 1, wherein the output data represents multiple sound levels in frequency or time.

4. The device of claim 1, further including:
an amplifier circuit configured to track sub-threshold sound signals in the environment of the device, threshold sound signals in the environment of the device, and supra threshold sound signals in the environment of the device.

5. The device of claim 4, wherein the amplifier circuit is further configured to sum the sub-threshold sound signals in the environment of the device, the threshold sound signals in the environment of the device, and the supra threshold sound signals in the environment of the device.

6. The device of claim 5, wherein the amplifier circuit includes:
an amplifier configured to apply a gain to the input stimulus to amplify the input stimulus,
wherein the gain is based on the sum of the sub-threshold sound signals in the environment of the device, the threshold sound signals in the environment of the device, and the supra threshold sound signals in the environment of the device.

7. The device of claim 1, wherein the circuit includes:
a RMS to DC converter configured to receive the input stimulus; and
an amplifier configured to receive the input stimulus from the RMS to DC converter and to amplify the input stimulus in accordance with a background sound level.

8. The device of claim 1, wherein the circuit is configured to detect sound signals in multiple frequency bands and further configured to detect when sound levels of at least a plurality of the sound signals in the multiple frequency bands increase or decrease over a specified amount of time, relative to sound levels of other sound signals detected at prior times;
wherein the circuit is further configured to increase a value of the adaptive threshold, when the sound levels of at least the plurality of the sound signals in the multiple frequency bands increase over the specified amount of time, with the increased value being in accordance with the detected increase; and
wherein the circuit is further configured to decrease a value of the adaptive threshold, when the sound levels of at least the plurality of the sound signals in the multiple frequency bands decrease over the specified amount of time, with the decreased value being in accordance with the detected decrease.

9. The device of claim 1, where the adaptive threshold is a threshold that varies over time.

10. The device of claim 1, wherein the device comprises an acoustic transducer.

11. An adaptive detection circuit to detect when an input stimulus to a sensor satisfies an adaptive threshold, the detection circuit comprising:
a band pass filter configured to receive an output from the sensor; and
a circuit fed from the band pass filter and configured to detect when the output from the sensor satisfies the adaptive threshold, and further configured to produce a signal upon detection to cause adjustment to operation of a device, with the adaptive threshold varying over time in accordance with detected changes in stimuli over a specified amount of time in an environment in which the device is located;
wherein the adaptive detection circuit further comprises:
a converter circuit to convert the signal from the band pass filter to a substantially DC signal;
a fixed gain amplifier to amplify the substantially DC signal;
a threshold circuit to establish a variable threshold level; and
a comparator circuit having a first input fed by the amplified substantially DC signal and a second input fed by the variable threshold level for producing a detection signal according to a value of the amplified substantially DC signal relative to a value of the variable threshold level.

12. The adaptive detection circuit of claim 11, wherein the band pass filter, the converter circuit, and the fixed gain amplifier comprise a first channel of the adaptive detection circuit, with the adaptive detection circuit further comprising:
at least one additional channel comprising a band pass filter, a converter circuit, and a fixed gain amplifier; and
a summing amplifier configured to receive outputs from the first channel and the at least one additional channel and further configured to provide an output that is fed to the first input.

13. The adaptive detection circuit of claim 12, wherein the band pass filter of the first channel and the band pass filter of the at least one additional channel have different frequency pass bands.

14. An adaptive detection circuit to detect when an input stimulus to a sensor satisfies an adaptive threshold, the detection circuit comprising:
a band pass filter configured to receive an output from the sensor; and
a circuit fed from the band pass filter and configured to detect when the output from the sensor satisfies the adaptive threshold, and further configured to produce a signal upon detection to cause adjustment to operation of a device, with the adaptive threshold varying over time in accordance with detected changes in stimuli over a specified amount of time in an environment in which the device is located, wherein the adaptive detection circuit further comprises:
a variable gain amplifier having an input that receives the input stimulus, a control port and an output to provide an amplified output signal;
a comparator circuit having a first input coupled to the output of the variable gain amplifier and a second input fed by a fixed threshold level signal for producing a detection signal according to a value of the amplified output signal relative to a value of the fixed threshold level signal; and
a feedback circuit configured to produce a control signal that controls gain of the variable gain amplifier.

15. The adaptive detection circuit of claim 14, wherein the adaptive detection circuit further comprises:
a high pass filter and a low pass filter coupled in series between the output of the variable gain amplifier and the input of the comparator circuit.

16. The adaptive detection circuit of claim 14, wherein the feedback circuit comprises:
a rectifier to convert the signal at the first input of the comparator circuit to a substantially DC signal;

an analog to digital converter to convert the substantially DC signal to a digital signal; and control logic configured to receive the digital signal and determines the value of the control signal fed to the control port of the variable gain amplifier.

17. The adaptive detection circuit of claim 16, wherein the feedback circuit comprises:

a low pass filter coupled between the rectifier and the analog to digital converter.

\* \* \* \* \*